United States Patent
Park

(10) Patent No.: US 7,183,603 B2
(45) Date of Patent: Feb. 27, 2007

(54) SEMICONDUCTOR DEVICE INCLUDING SQUARE TYPE STORAGE NODE AND METHOD OF MANUFACTURING THE SAME

(75) Inventor: Je-Min Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 11/096,852

(22) Filed: Mar. 31, 2005

(65) Prior Publication Data

US 2005/0218440 A1    Oct. 6, 2005

(30) Foreign Application Priority Data

Mar. 31, 2004    (KR)    ............. 10-2004-0022025

(51) Int. Cl.
*H01L 27/108*    (2006.01)
(52) U.S. Cl. .............. 257/298; 257/296; 257/300; 257/E27.084
(58) Field of Classification Search ................ 257/298
See application file for complete search history.

(56) References Cited

U.S. PATENT DOCUMENTS 6,381,165 B1 *   4/2002   Lee et al. ............... 365/51

2002/0003256 A1    1/2002   Maegawa

FOREIGN PATENT DOCUMENTS

| JP | 10-98168 | 4/1998 |
|---|---|---|
| KR | 2003-0074478 | 9/2003 |

OTHER PUBLICATIONS

English language abstract of Korean Publication No. 2003-0074478.
English language abstract of Japanese Publication No. 10-98168.

* cited by examiner

*Primary Examiner*—Tu-Tu Ho
(74) *Attorney, Agent, or Firm*—Marger Johnson & McCollom, P.C.

(57) ABSTRACT

A semiconductor device including square type storage nodes and a method of manufacturing the same. Word lines are formed on a semiconductor substrate Bit lines are formed separated from the word lines and perpendicular to the word lines. Active regions are defined to have a major axis slanted to the word line direction and the bit line direction. Storage nodes of capacitors are arranged along the word lines overlapping the word lines and arranged in a zigzag pattern that centers upon the bit lines. Storage node contacts are formed to electrically connect the active regions to the storage nodes, while being self-aligned with the bit lines, separated from each other on the word lines, and with a larger line width in the word line direction than the bit line direction to overlap large areas of the storage nodes.

35 Claims, 25 Drawing Sheets

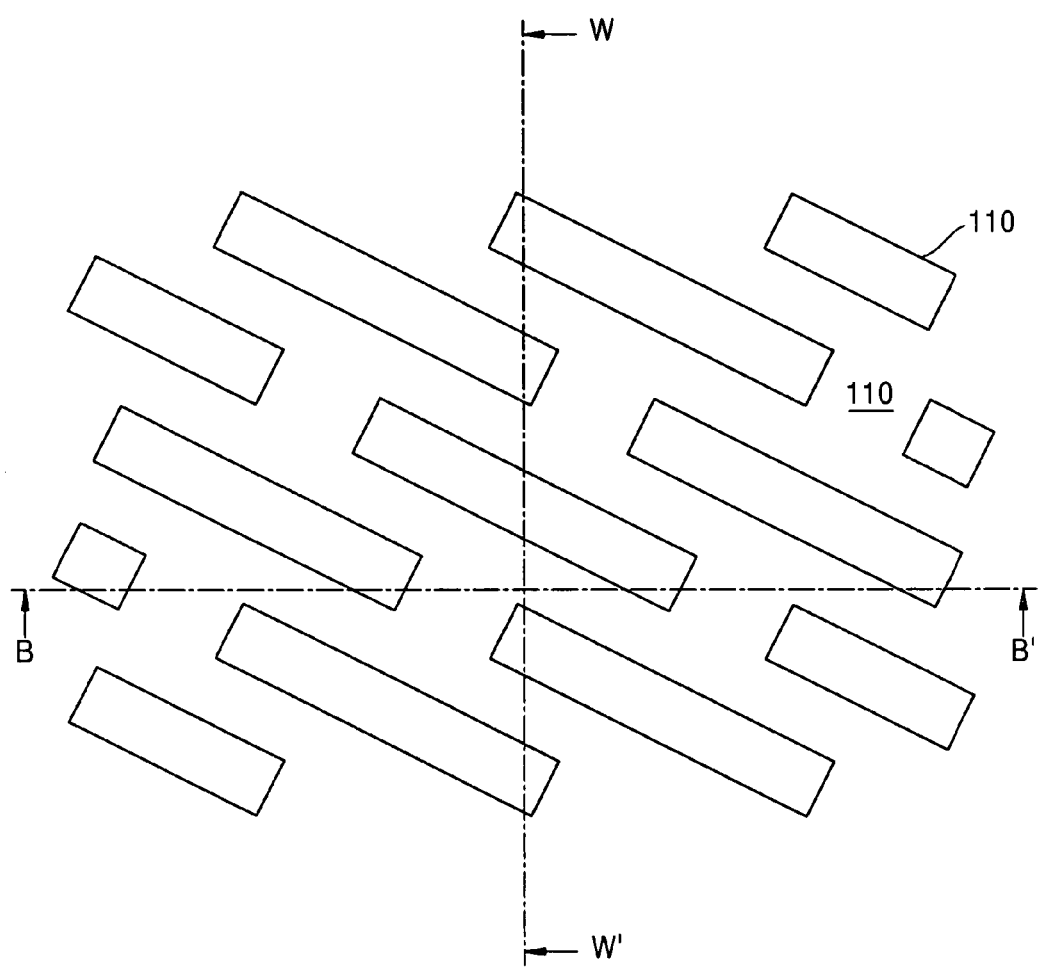

SEMICONDUCTOR DEVICE INCLUDING SQUARE TYPE STORAGE NODE AND METHOD OF MANUFACTURING THE SAME

BACKGROUND OF THE INVENTION

This application claims the priority of Korean Patent Application No. 2004-22025, filed on Mar. 31, 2004, in the Korean Intellectual Property Office, the disclosure of which is incorporated herein in its entirety by reference.

1. Field of the Invention

The present invention relates to a semiconductor device, and more particularly, to a semiconductor including square type storage nodes for securing the capacitance of capacitors while reducing a cell size and a method of manufacturing the same.

2. Description of the Related Art

As the technology of manufacturing a semiconductor device improves, the size of transistors is reduced and the integration of a semiconductor device is rapidly increased. The reduction of a chip size is important to develop a high integration memory semiconductor device. In the case of a dynamic random access memory (DRAM) device, the device is highly integrated like 1 gigabits (G), 4 G, 8 G. Thus, chip size must be reduced. For example, new cell structures, such as 7F2, 6F2, and 4F2 structures, that are derived from an 8F2 structure are provided to reduce the chip size. Such cell structures are known for reducing the chip size even when applied to a minimum line width F, which is the same as that of the 8F2 cell structure.

On the other hand, the data retention characteristic, in other words, the refresh characteristic is recognized as an important factor in determining the stable operation characteristic of a device. Examples of the factors for determining the refresh characteristic include the capacitance of a cell capacitor, a bit line loading capacitance, and various cell leakage currents generated in connection with a storage node. The absolute amount of charges stored in a cell capacitor of a DRAM device is reduced over time because various leakage currents are generated. Thus, the previously stored information is refreshed within a predetermined time interval. Here, the above-described factors play important roles in determining the refreshing time interval.

Thus, it is important to secure the capacitance of a stable capacitor in order to secure a data storage characteristic even when such a new cell structure is used. In order to increase the capacitance of the cell capacitor, the dielectric layer of the capacitor must be formed of a material having a high dielectric constant or the effective area of the capacitor must be increased.

In order to increase the effective area of the capacitor, the area and the stack height of a unit cell capacitor are increased. However, the increase of the stack of the capacitor in a capacitor over bit line (COB) structure has a limit, because the stack may fall down. Thus, the area occupied by the capacitors should be previously secured in order to increase the effective area of the capacitor.

However, it is known that the area occupied by capacitors in such a new cell structure is reduced from the area in the 8F2 cell structure by more than 50%. Thus, the secure of the capacitance of the capacitor becomes a precondition of adopting such a new cell structure.

FIG. 1 is a plan view illustrating a conventional DRAM semiconductor device of 6F2 structure.

Referring to FIG. 1, in a diagonal array type structure of conventional 6F2 cell structures, one memory cell is formed at the crossing point of word line 20 and bit line 50 that are perpendicular to each other. In addition, the major axis of an active region 11, defined by a device isolation region 15, is arranged in a direction diagonal to the word line 20 and the bit line 50.

In this case, the distance between the word lines 20 is twice the minimum pitch or minimum line width F, and the distance between the bit lines 50 is three times the minimum pitch F. Accordingly, the cell size of the 6F2 structure is smaller than the cell size of the 8F2 structure.

However, storage nodes 80 are formed on the bit lines 50 to form capacitors of the COB structure, in order to realize a DRAM cell, as shown in FIG. 1. The storage nodes 80 are electrically connected to first contact pads 41 that are preliminarily arranged to electrically connect the active regions 11 between the word lines 20, by interconnections such as storage contacts.

In order to smoothly connect the storage nodes 80 to the active regions 11, the storage nodes 80 overlap the first contact pads 41 and the storage contacts overlap the first contact pads 41. Six storage nodes 80 are arranged to form a hexagon due to the arrangement of the active region 11, and the storage node 80 is not formed on an area A at the center of the storage nodes 80 array, which form a hexagon.

Such an empty area A exists at a location of a second contact pad 45 where the bit line 50 and a bit line connect contact of electrically connecting the active region 11 overlap. The empty area A reduces the area of the storage nodes 80. Accordingly, the area to be occupied by the storage nodes 80 is reduced in a unit cell area.

For example, in the case of a device in which storage nodes 80 are formed as a one cylindrical stack (OCS) structure while having a design rule of 80 nm, a separation distance of at least 60 nm should be secured between the storage nodes 80, in order to prevent an electrode fall-down phenomenon or a bridge phenomenon between adjacent storage nodes 80.

When considering the separation distance of 60 nm, the pitch of the storage node 80 becomes 2F, in other words, about 160 nm. Thus the diameter of the area occupied by the storage nodes 80 becomes about 100 nm. Since the area occupied by the storage nodes 80 is small, the stack height of the storage nodes 80 is limited. Actually, it is difficult to form the storage nodes 80 in a cylinder shape within such an area. Thus, it is difficult to improve the capacitance of the capacitors using such storage nodes 80.

In order to practically use the new cell structure as 6F2 in a memory semiconductor device like DRAM, it is required to increase an area occupied by storage nodes 80. Even when $Ta_2O_5$ or $Al_2O_3$ is used instead of a conventional NO dielectric layer, the effective area of the capacitors should be increased to secure the capacitance of the cell capacitors, because the dielectric constant of such a dielectric material is similar to conventional dielectric material. As a result, the area of the storage nodes 80 must be increased.

SUMMARY OF THE INVENTION

The present invention provides a semiconductor device that reduces cell size through changing the cell structure by increasing an area occupied by capacitors and a method of manufacturing the same.

In an embodiment of the invention, word lines are formed on semiconductor substrate in a word line direction. Bit lines are formed on the substrate in a bit line direction perpendicular to the word line direction. Active regions are defined on the substrate with a major axis that is slanted to the word and bit line directions. Capacitor storage nodes are arranged in a line in the word line direction, overlapping the word lines, and in a zigzag pattern in the bit line direction with the zigzag pattern centered on the bit lines. Storage node contacts connect the active regions with the capacitor storage nodes.

In another embodiment, auxiliary expansion pads may be used to connect the capacitor storage nodes to the storage node contacts. The auxiliary expansion pads may be arranged to overlap the storage node contacts and extend in the word line direction relative to the storage node contacts to overlap larger areas of the capacitor storage nodes.

BRIEF DESCRIPTION OF THE DRAWINGS

The above and other features and advantages of the present invention will become more apparent by describing in detail an exemplary embodiment thereof with reference to the attached drawings in which.

DETAILED DESCRIPTION OF THE INVENTION

Figure 1:
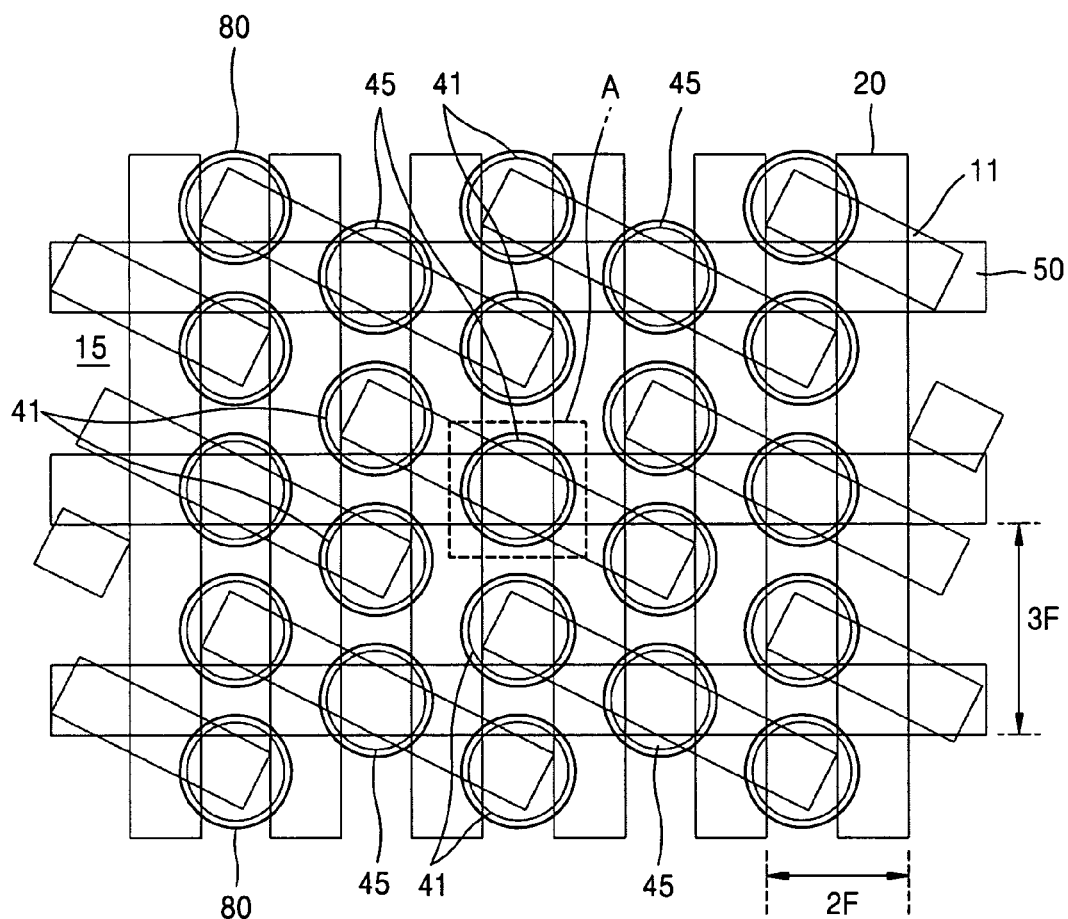
FIG. 1 is a plan view illustrating a conventional DRAM semiconductor device of 6F2 cell structure.
Figure 1:
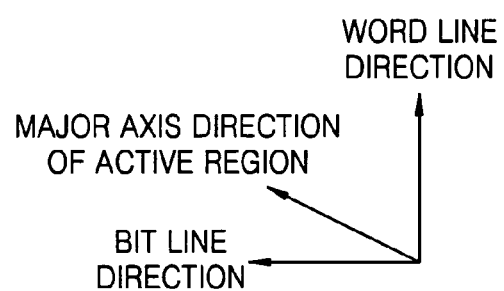

The present invention will now be described more fully with reference to the accompanying drawings, in which an exemplary embodiment of the invention is shown. The invention may, however, be embodied in many different forms and should not be construed as being limited to the embodiment set forth herein; rather, this embodiment is provided so that this disclosure will be thorough and complete, and will fully convey the concept of the invention to those skilled in the art.

In an embodiment of the present invention, a memory semiconductor device, such as DRAM, is realized by using cell structures like a $6F^2$ cell structure, which realize a smaller cell area than an $8F^2$ cell structure, and a $6.6F^2$ (2F*3.3F) cell structure, which is transformed from the $6F^2$ structure. Here, in order to secure the capacitance of capacitors that is required due to the reduction of a cell area, the arrangement of storage nodes on bit lines or word lines is changed to increase the area occupied by the storage nodes.

In order to solve an electric interconnection problem between the storage nodes and active regions, which is caused by changing the arrangement of the storage nodes, storage node contacts that are expanded toward the word lines and a method of manufacturing the same are provided. In addition, an interconnection auxiliary pattern, which is located between the storage node contacts and the storage nodes while being expanded toward the word lines, and a method of manufacturing the same are provided.

Accordingly, the problem of securing the capacitance of the capacitors in the $6F^2$ structure can be solved. Thus, the $6F^2$ cell structure or a similar structure having a cell size smaller than the $8F^2$ cell structure can be applied to a memory device like DRAM, more specifically, a DRAM memory device of a capacitor over bit line (COB) structure.

In addition, an area occupied by storage nodes of the capacitors that are formed on the bit lines is formed in a square type. Here, the square type may be understood as a planar shape having a major axis and a minor axis in the same length. For example, the X-axis pitch and the Y-axis pitch on an X-Y coordinates form 1:1, in other words, the area occupied by the storage nodes is formed in the shape of a rectangle, a lozenge, or a circle.

Here, the area occupied by the storage nodes is formed in a square shape to secure the separation distance between the storage nodes within a limited area while increasing the area occupied by the storage nodes. As a result, the capacitance of the capacitors using such storage nodes is increased.

A semiconductor device according to an embodiment of the present invention will now be described by using the $6F^2$ cell structure. However, the semiconductor device according to the embodiment of the present invention can be applied to a cell structure transformed from the $6F^2$ cell structure, for example, $6.6F^2$ (2F×3.3F), which has a reduced cell area compared to the $8F^2$ cell structure.

Figure 2:
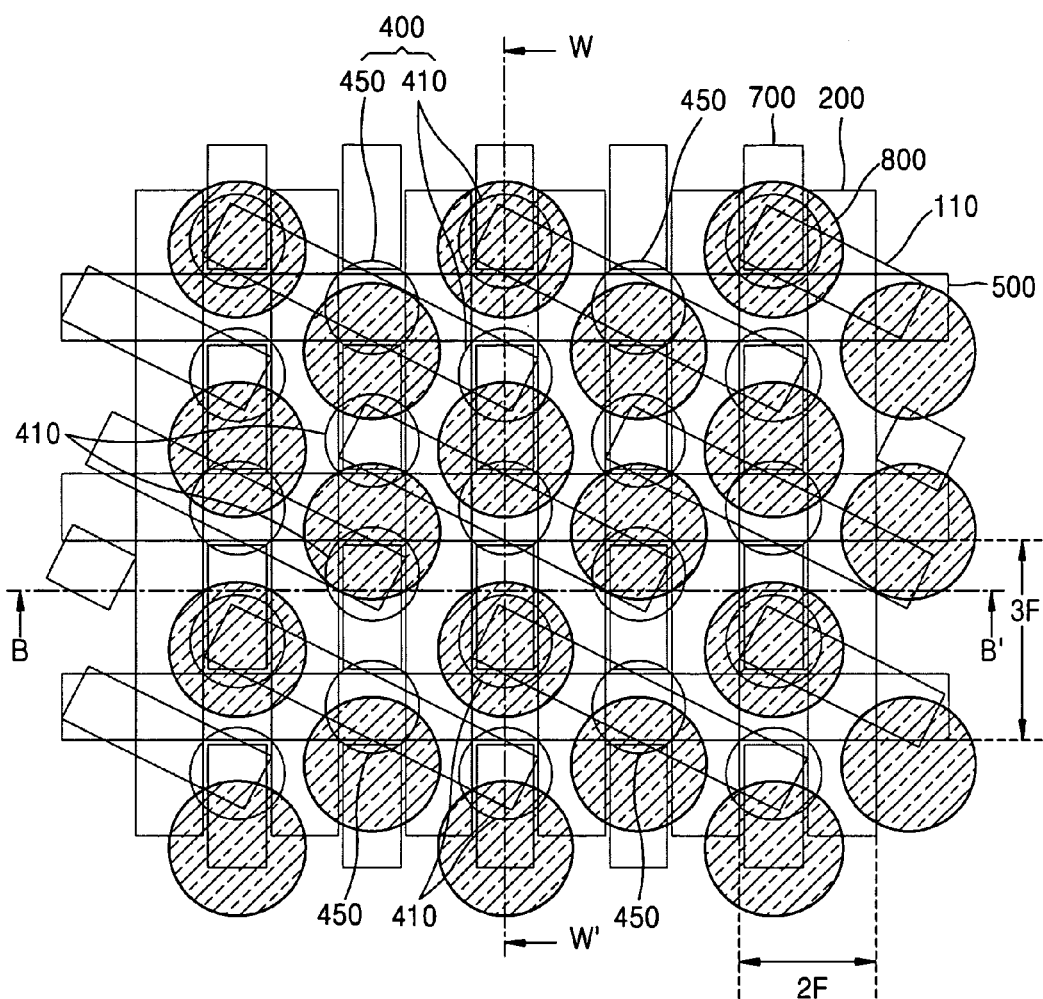
FIG. 2 is a plan view illustrating a semiconductor device using square type storage nodes according to an embodiment of the present invention.
Figure 2:
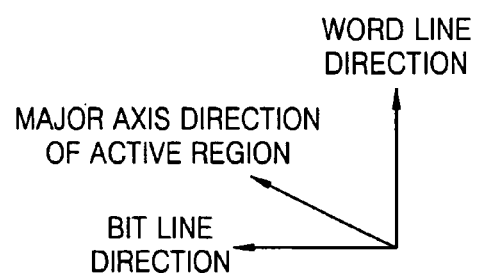

FIG. 2 is a plan view illustrating a semiconductor device using square type storage nodes according to an embodiment of the present invention.

Referring to FIG. 2, the semiconductor device according to the embodiment of the present invention can be formed of a DRAM semiconductor device using a COB structure. Here, the cell structure of the semiconductor device may be a diagonal array type structure.

In the $6F^2$ cell structure, active regions 110 are defined by device isolation regions 150. Here, the major axis of the active region 110 is formed in a slanting direction. Word lines 200 and bit lines 500 are perpendicular to each other. One DRAM memory cell is formed at the crossing position of the word line 200 and the bit line 500. The major axes of the active regions 100 are slanted with respect to the word lines 200 and the bit lines 500.

In this case, the distance between the word lines 200 is twice a minimum pitch or a minimum line width F, and the distance between the bit lines 500 is three times of the minimum pitch F. Accordingly, the cell size of the $6F^2$ cell structure is reduced compared to the $8F^2$ cell structure. The major axes of the active regions 110 are slanted to the bit lines 500, and the ends of the active regions 110 at the major axis directions that electrically connect to the bit lines 500 deviate from the bit lines 500 by about 1F.

In such cell structure, areas occupied by storage nodes 800 of capacitors that form the DRAM semiconductor device are formed in the shape of a rectangle or a lozenge. Accordingly, the storage nodes 800 are arranged in a line in the direction of the word lines 200; however, the storage nodes 800 are zigzagged in the direction of the bit lines 500 centering upon the bit lines 500. In other words, one storage node 800 is biased to the left side of the bit line direction, and the next storage node 800 is biased to the right side of the bit line direction. Such arrangement of the storage nodes 800 is different from the conventional arrangement of storage nodes 80 in the hexagonal shape shown in FIG. 1.

As a result, the areas occupied by individual storage node 800 may be increased within a limited area. In the conventional arrangement of FIG. 1, an empty area A occurs in the hexagon, which is formed by the storage nodes 80; however, an empty area is not formed in the lozenge of FIG. 2, which is formed by the storage nodes 800. Accordingly, the area occupied by the storage nodes 800 can be increased.

For example, when storage nodes 800 or 80 are formed in a one cylindrical stack (OCS) structure using a design rule of 80 nm, a separation distance between storage nodes 800 or 80 should be at least 60 nm. Here, the storage nodes 800 or 80 are formed in a square-like shape, for example, in a circle or a rectangle, to improve the efficiency of securing the area.

When considering the separation distance of 60 nm, the pitch of the storage nodes 80 in FIG. 2 is 2F, in other words, about 160 nm. Thus the diameter of the area occupied by the storage nodes 80 is about 100 nm in the conventional arrangement. In the arrangement of the storage nodes 800 in FIG. 2, the pitch of the storage nodes 800 can be increased to 210 nm, theoretically, even when the separation distance of 60 nm is considered. Accordingly, the capacitance of the capacitors using the storage nodes 800 can be largely increased.

Thus, the area occupied by the storage nodes 800 is increased, and the stack height of the storage nodes 800 may be increased. As a result, the effective surface area of the capacitors can be significantly increased.

On the other hand, the storage nodes 800 are zigzagged in the bit line direction, thus the electric interconnection between the storage nodes 800 and the active regions 110 may be unstable.

In order to operate a DRAM semiconductor device normally, the storage nodes 800 of the capacitors should be smoothly connected to the active regions 110. The electric interconnection between the storage nodes 800 and the active regions 110 is formed by an interconnection contact structure. Here, the contact areas between the interconnection contact structure and the storage nodes 800 may be reduced when the storage nodes 800 deviate from the active regions 110.

The interconnection contact structure in the semiconductor device may be formed of a plurality of interconnection contacts such as contact pads 400 and interconnection contacts formed thereon. Here, the contact pads 400 directly contact the active regions 100 between the word lines 200 in order to prevent the increase of interconnection contact resistance due to the reduction of a design rule.

The contact pads 400 are divided into first contact pads 410 such as buried contact (BC) pads, and second contact pads 450, such as direct contact (DC) pads. First contact pads 410 are connected to the storage nodes 800. Also, the first contact pads 410 are introduced to under storage node contacts. Second contact pads 450 are connected to the bit lines 500. Also the second contact pads 450 are introduced to under bit line contacts. Here, the first contact pads 410 and the second contact pads 450 are formed at the same time.

Since the first and second contact pads 410 and 450 should be formed in limited areas between the word lines 200, the size of the first and second contact pads 410 and 450 is limited by the distance between the word lines 200. In addition, the first contact pads 410 as BC pads should be separated from the second contact pads 450 arranged under the bit lines 500 by a predetermined distance while being insulated from the second contact pads 450. Accordingly, the first contact pads 410 as BC pads are formed on the active regions 110, which are not overlapped by any one of the bit lines 500 on the word lines 200. In other words, the location of the first contact pads 410 is limited by the locations of the bit lines 500 and the word lines 200.

Since the storage nodes 800 are zigzagged centering upon the bit lines 500, the first contact pads 410 and the storage nodes 800 cannot be precisely overlapped. As shown in FIG. 2, the centers of the first contact pads 410 and the storage nodes 800 may not correspond to each other.

Thus, only small portions of the storage nodes 800 and the first contact pads 410 are overlapped. In this case, the contact area between the storage nodes 800 and the first contact pads 410 or between the storage nodes 800 and the storage node contacts, which are formed between the storage nodes 800 and the first contact pads 410, is reduced. Thus contact resistance is increased. Accordingly, the interconnection contacts formed between the first contact pads 410 and the storage nodes 800, for example, the storage node contacts, are transformed in order to smoothly connect the storage nodes 800 and the first contact pads 410. For example, a storage node contact, which is expanded toward the storage node 800, for example, in the word line direction, and a method of forming the storage node contact will be provided.

Hereafter, the embodiment of the present invention will be specifically described by providing plan views and cross-sectional views taken along the word line direction, line W–W' and the bit line direction, line B–B'.

FIGS. 3A through 10C illustrate a method of manufacturing a semiconductor device according to the embodiment of the present invention.

Figure 3B:
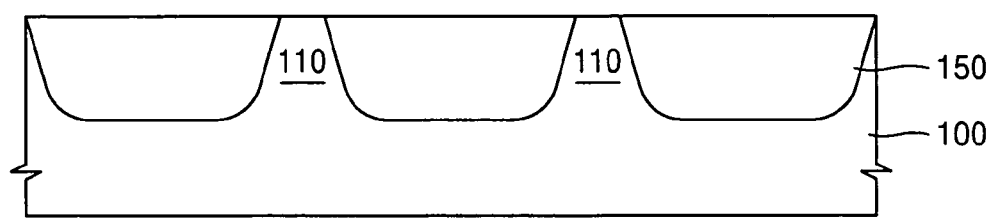
FIGS. 3A through 9C illustrate a method of Manufacturing a semiconductor device using the square type storage nodes of FIG. 2.
Figure 3C:
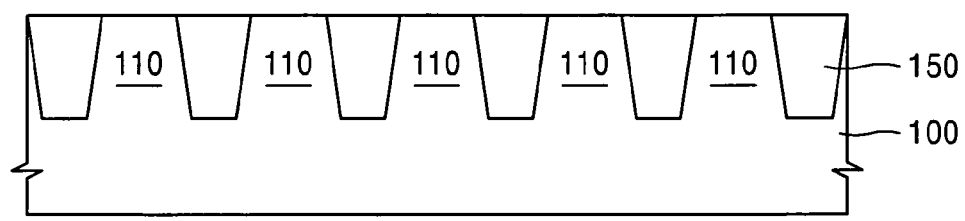

FIG. 3A is a plan view illustrating a state where the active regions 110 are defined on a semiconductor substrate. FIGS. 3B and 3C are cross-sectional views taken along lines B–B' and W–W', respectively, of FIG. 3A to show the state where the active regions 110 are defined on the semiconductor substrate 100. Here, line B–B' is formed along the bit line direction of FIG. 2, and line W–W' is formed along the word line direction of FIG. 2.

Referring to FIGS. 3A through 3C, device isolation regions 150 defining the active regions 110 are formed by performing a device isolation process, for example, a trench isolation, on the silicon substrate 100. The device isolation regions 150 may define various shapes of active regions. However, the device isolation regions 150 are formed in a straight type where the major axes of the adjacent active regions 110 are arranged in the same direction. Here, the device isolation regions 150 are formed of an insulating material, such as silicon oxide that fills trenches.

The major axes of the active regions 110 are slanted to the bit line direction of the word line direction as shown in FIG. 2 to realize the $6F^2$ cell structure.

Thereafter, a photo process and an ion implantation process may be performed in order to form wells (not shown) and channels of transistors on the semiconductor substrate 100.

Figure 4A:
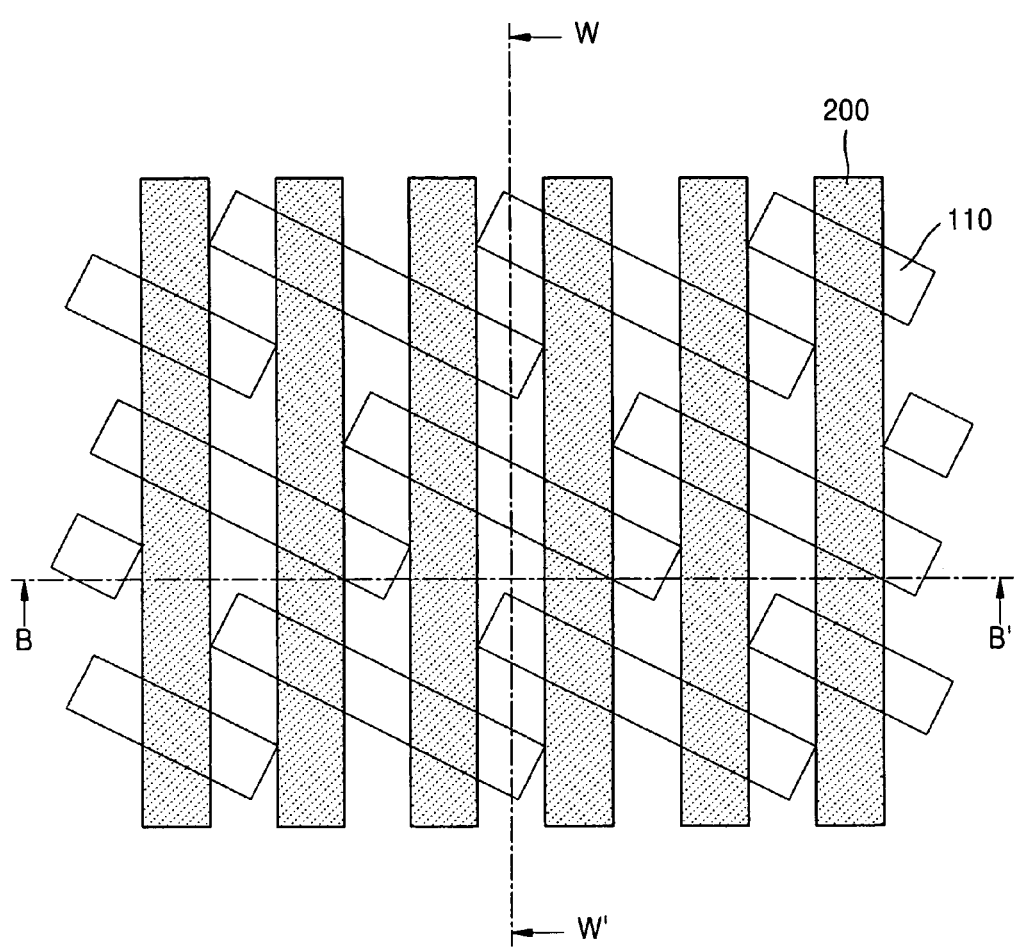
Figure 4B:
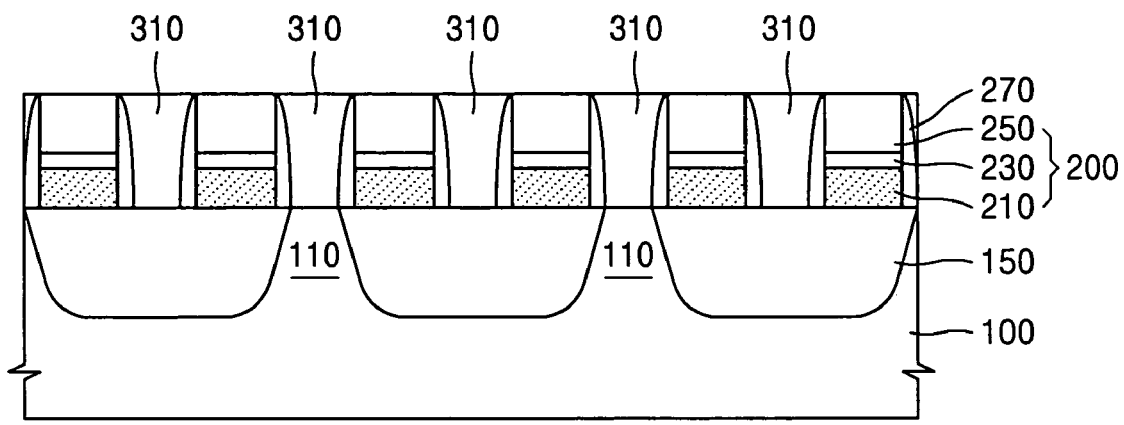
Figure 4C:
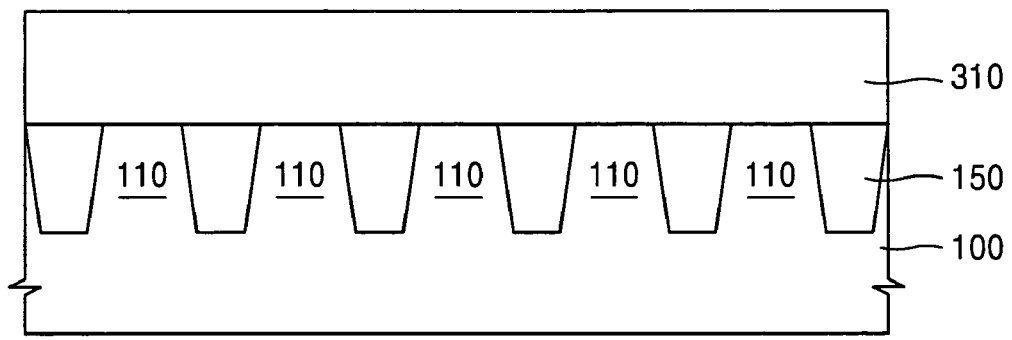

FIG. 4A is a plan view illustrating a state where the word lines 200 are formed on the semiconductor substrate 100. FIGS. 4B and 4C are cross-sectional views taken along lines B–B' and W–W', respectively, of FIG. 4A.

Referring to FIGS. 4A through 4C, the word lines 200 are formed across the active regions 110 by using a gate process. More specifically, a pad oxide layer (not shown), which is prepared for ion implantation processes, is removed from the active regions 110 by a wet etch, and a thermal oxide layer is grown on the active regions 110 to form a gate oxide layer (not shown). Here, the thickness of the gate oxide layer is determined based on the characteristics of the device.

Thereafter, gate layers 210 and 230 and a gate capping layer 250 are sequentially formed on the gate oxide layer. Here, the gate layers 210 and 230 may be formed by depositing conductive materials. For example, a doped polysilicon layer as the gate layer 210 having conductivity is deposited, and a metal silicide layer as the gate layer 230 is formed thereon to improve the conductivity of the gate. An example of the metal silicide layer is a tungsten silicide layer. An example of the gate capping layer 250, which is formed on the tungsten silicide layer 230 to protect the gate from following etch processes, is a silicon nitride layer.

Thereafter, the gate capping layer 250 and the gate layers 210 and 230 are sequentially patterned by performing the photo process and the etch. Thus a plurality of word lines 200 are formed. Then, the source and drain regions of transistors are formed in a lightly doped drain (LDD) structure by performing a photo process and an ion implantation process according to the characteristic and the regions of the transistor to be realized.

Gate spacers 270 are formed on the sidewalls of the gates 210 and 230 by performing a spacer forming process in which an insulating layer covering the word lines 200 is formed and that insulating layer is etched. The gate spacers 270 may be formed of silicon nitride, and cover the sidewalls of the gates 210 and 230 to protect the gates 210 and 230.

Thereafter, a first insulating layer 310 as a first interlevel dielectric (ILD1) is deposited in the spaces between the word lines 200. The first insulating layer 310 may be formed of a silicon oxide that has an excellent gap filling characteristic, such as high density plasma (HDP) oxide or borophosilicate glass (BPSG). Then, the upper surface of the first insulating layer 310 is planarized by a chemical mechanical polishing (CMP)

Figure 5A:
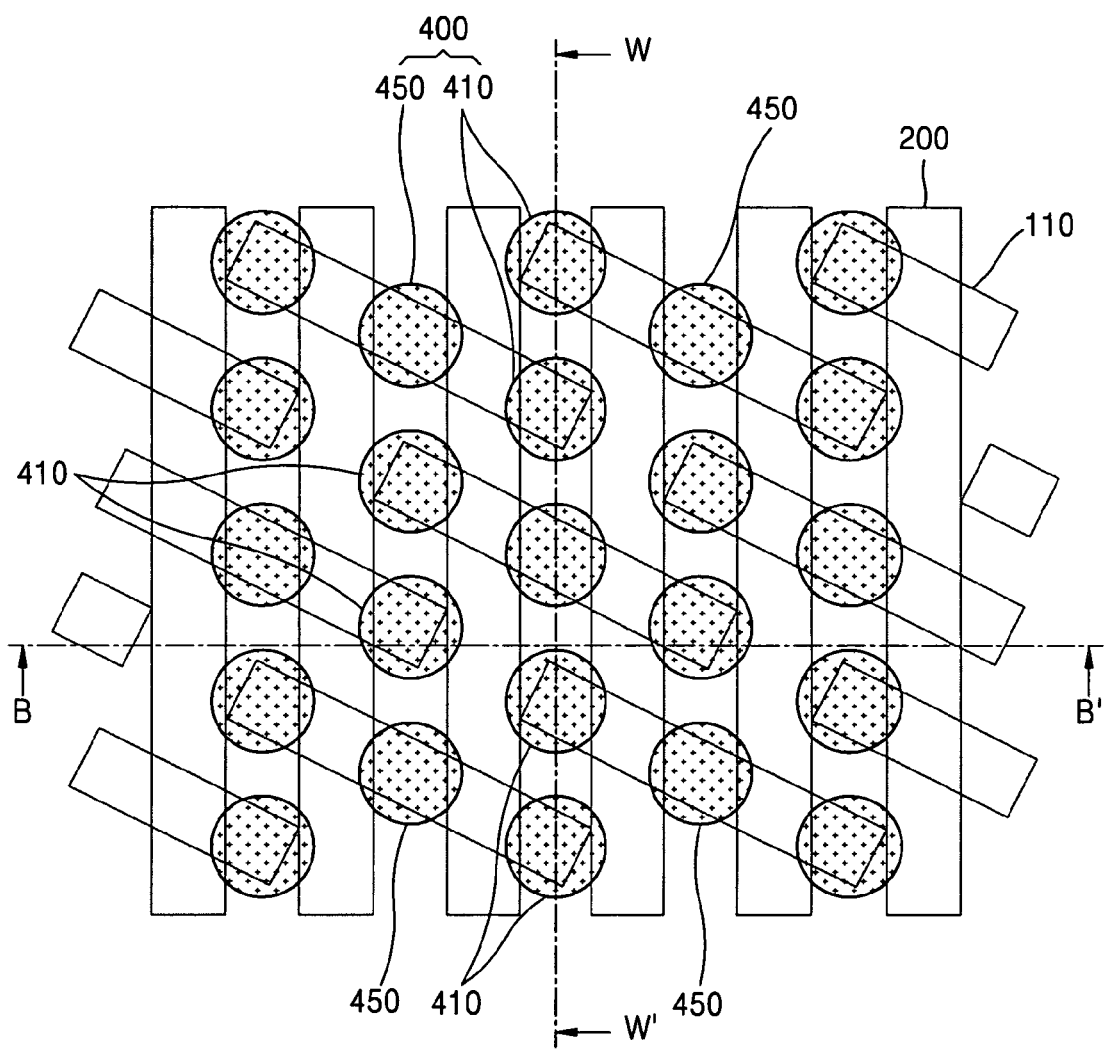
Figure 5B:
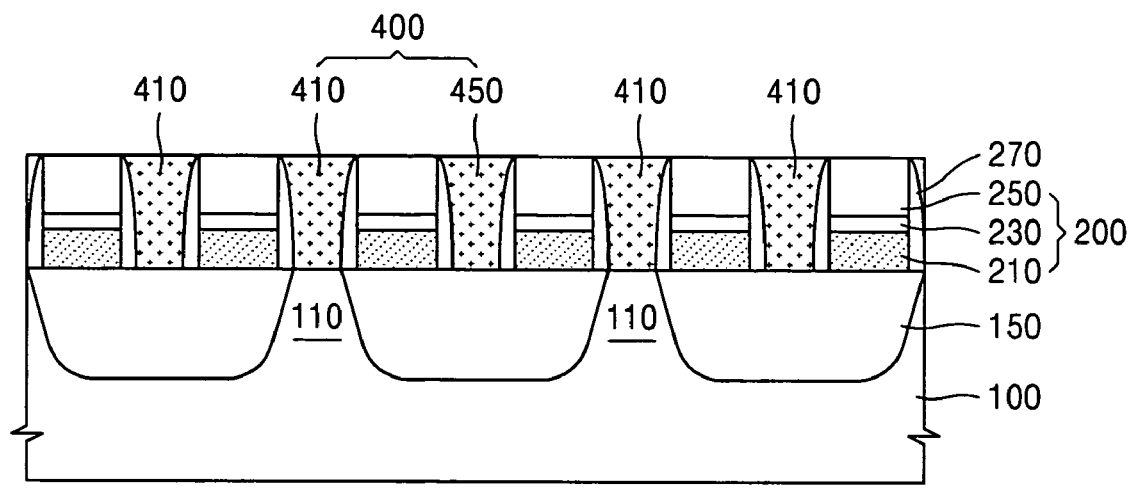
Figure 5C:
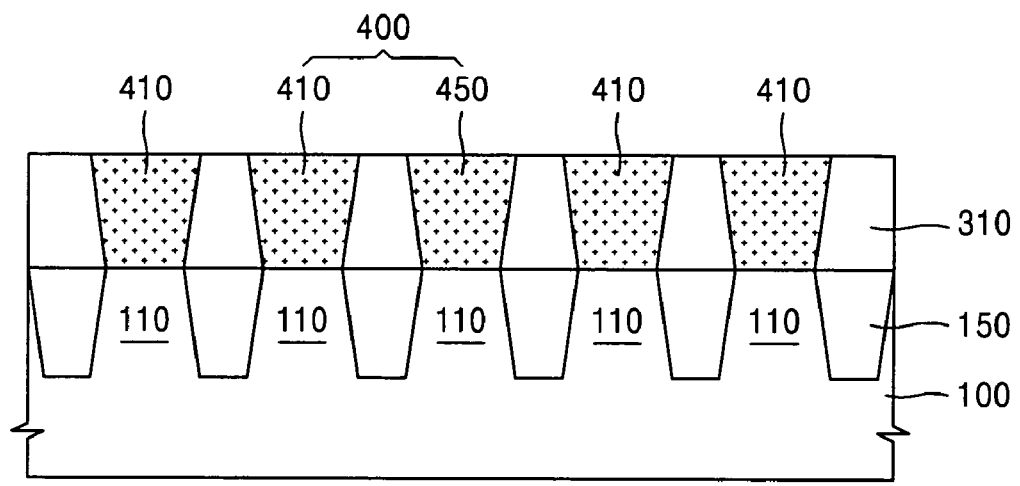

FIG. 5A is a plan view illustrating a state where the contact pads 410 and 450 are formed. FIGS. 5B and 5C are cross-sectional views taken along lines B–B' and W–W', respectively, of FIG. 5A.

Referring to FIGS. 5A through 5C, a plurality of contact pads 400 are formed by performing a self-aligned contact (SAC) process on the first insulating layer 310. The contact pads 400 may be divided into first contact pads 410, BC pads that are arranged to electrically interconnect to the storage nodes, and second contact pads 430, DC pads that are arranged to electrically interconnect to the bit lines. The first contact pads 410 and the second contact pads 450 are separated by the word lines 200.

Hereafter, the process of forming the contact pads 410 and 450 will be described. Portions of the first insulating layer 310 on which the bit line contacts and the storage node contacts will be formed are selectively removed to expose the active regions 110 by performing a photo process and a selective etch process. Thus first contact holes are formed.

Then, an ion implantation process is performed on the exposed active regions 110 to induce the reduction of the contact resistance between the active regions 110 and the contact pads 410 and 450. A conductive material, such as a doped polysilicon including an n-type impurity, is deposited to fill the first contact holes. Thereafter, the conductive material is etched back or chemical mechanical polished to expose the upper surface of the gate capping layer 250, which is formed on the word lines 200.

Figure 6A:
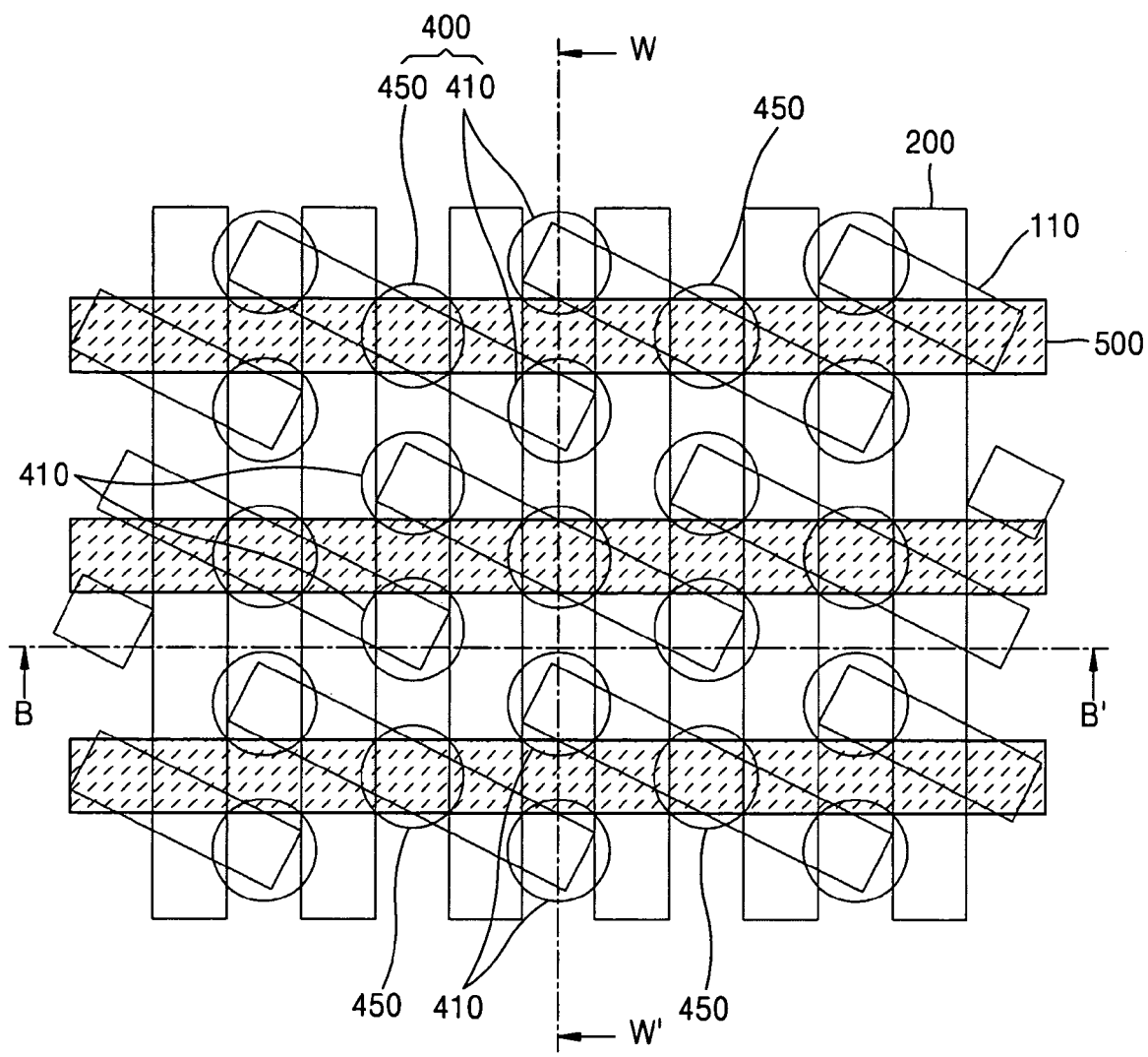
Figure 6B:
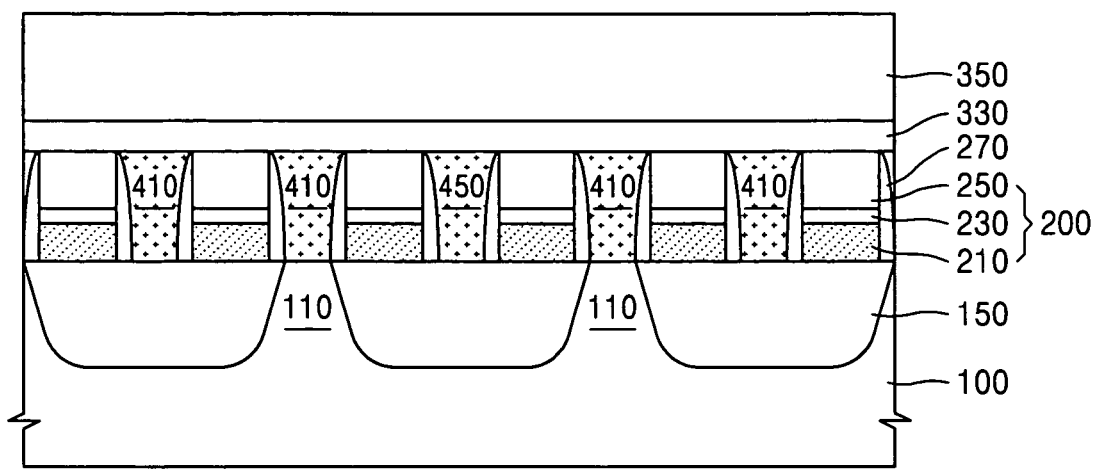
Figure 6C:
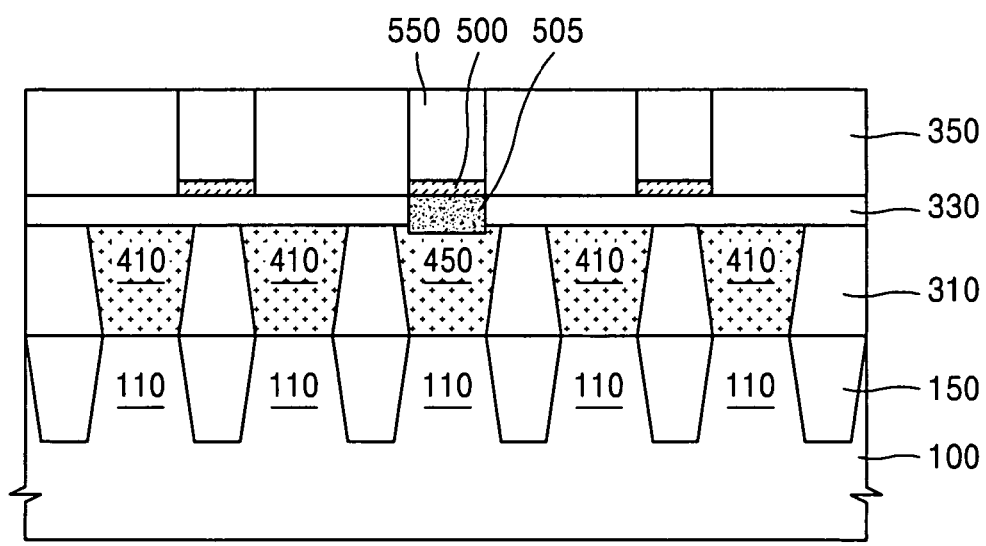

FIG. 6A is a plan view illustrating a state where the bit lines 500 are formed. FIGS. 6B and 6C are cross-sectional views taken along lines B–B' and W–W', respectively, of FIG. 6A.

Referring to FIGS. 6A through 6C, a second insulating layer 330, that is an ILD2 covering the contact pads 410 and 450, is formed on the first insulating layer 310. Here, the second insulating layer 330 is formed to insulate the first contact pads 410 (BC pads) from the bit lines 500. Accordingly, the second insulating layer 330 is formed of an insulating material, such as a silicon oxide.

Then, second contact holes are formed through the second insulating layer 330 by a photo etch process by selectively exposing the second contact pads 450, in other words, the upper surfaces of the DC contact pads. Such second contact holes are formed to form bit line contacts 505 as interconnection contacts of electrically connecting the second contact pads 450 to the bit lines 500.

The bit line contacts 505 filling the second contact holes are formed to electrically connect the bit lines 500 and the second contact pads 450. Here, the bit line contacts 505 are formed by depositing a barrier metal layer such as a TiN layer, or a metal conductive layer such as a tungsten layer, and planarizing the metal layer by performing an etch back or a CMP.

Thereafter, the bit lines 500 electrically connecting to the bit line contacts 505 are formed by performing a bit line forming process. For example, another barrier metal layer, such as a TiN layer, or another metal conductive layer, such as a tungsten layer, is deposited and patterned, thus the bit lines 500 are formed. Here, the bit line contacts 505 filling the second contact holes electrically connect the bit lines 500 to the second contact pads 450.

A bit line capping insulating layer 550, formed of an insulating material such as silicon nitride, is formed on the bit lines 500 and patterned along with the bit lines 500. Bit line spacers, formed of an insulating material such as silicon nitride, may be formed on the sidewalls of the bit lines 500; however, the bit line spacers may be omitted as shown in FIG. 6C. The bit line capping insulating layer 550 is preliminarily introduced in order to prevent the bit lines 500 from being damaged when forming storage node contacts, such as buried contacts.

Thereafter, the bit lines 500 are formed, and a third insulating layer 350 of covering the bit lines 500 is formed. Here, the third insulating layer 350 is formed by depositing a silicon oxide layer that has an excellent gap fill characteristic, such as HDP oxide and BPSG. Then, the surface of the third insulating layer 350 is planarized by CMP to expose the upper surface of the bit line capping insulating layer 550.

In this case, the third insulating layer 350 is deposited before introducing the spacers at the sidewalls of the bit lines 500, and thus the gap between the bit lines 500 is large compared to the case where the spacers are formed at the sidewalls of the bit lines 500. Thus, the generation of voids can be efficiently prevented when depositing the third insulating layer 350. In other words, a process margin for the voids is secured.

Figure 7A:
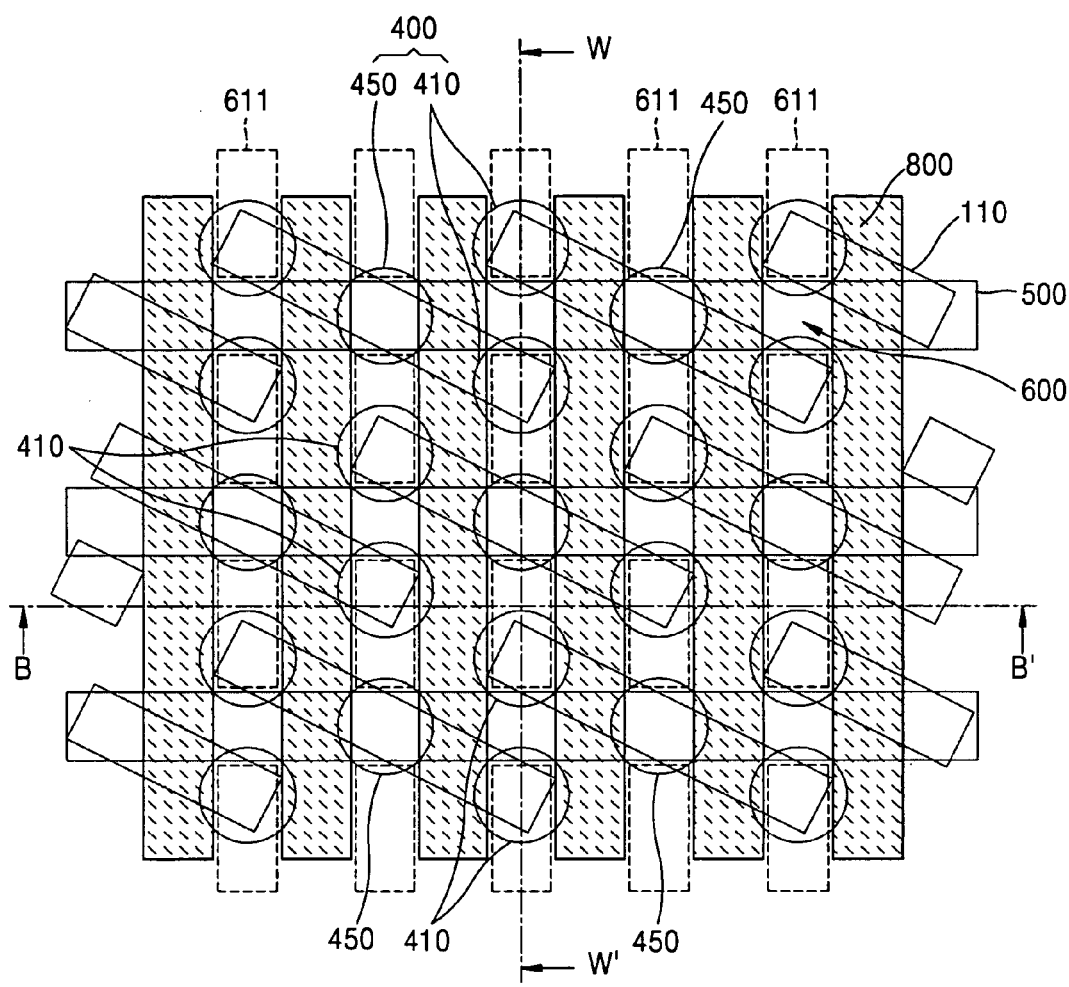
Figure 7B:
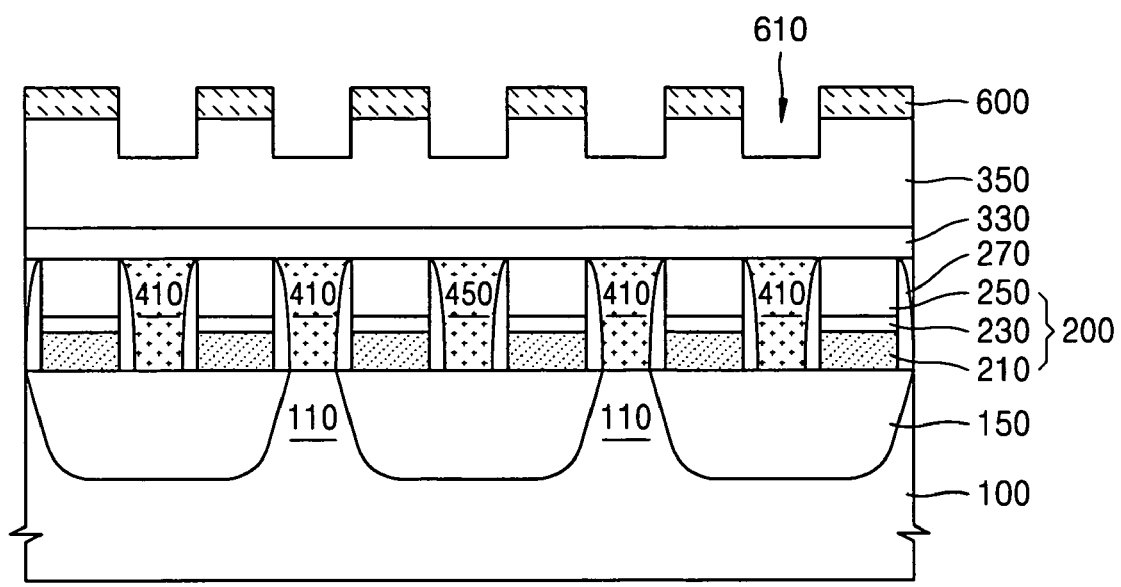
Figure 7C:
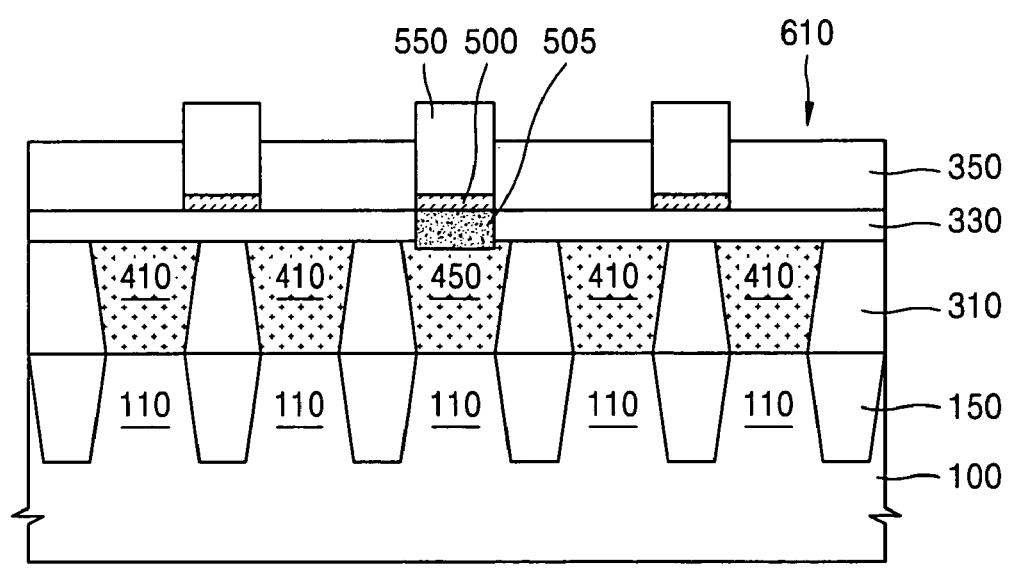
Figure 7D:
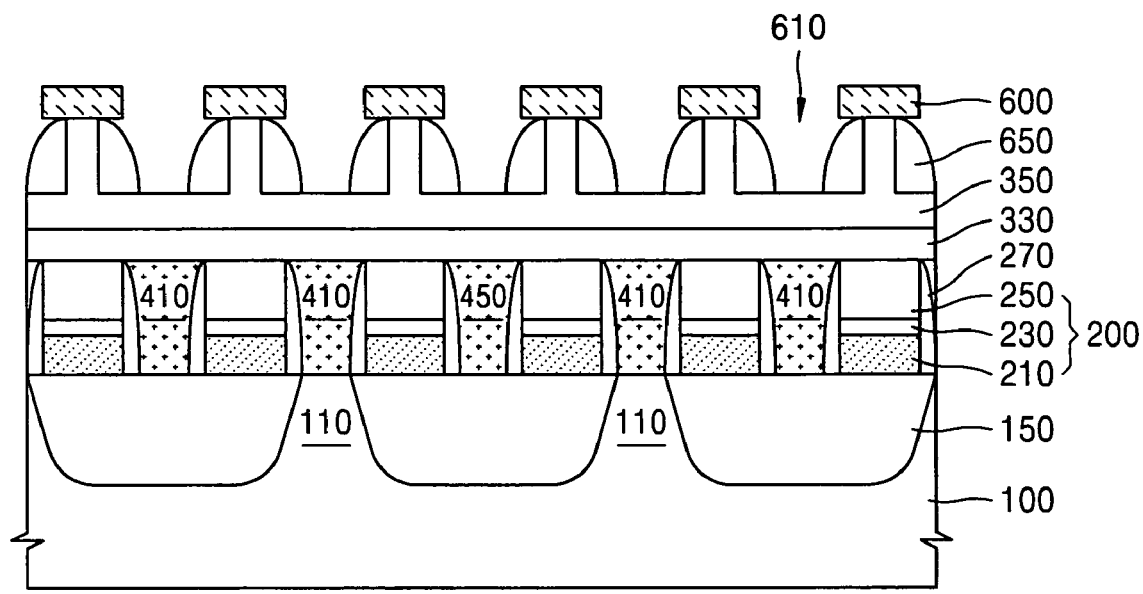
Figure 7E:
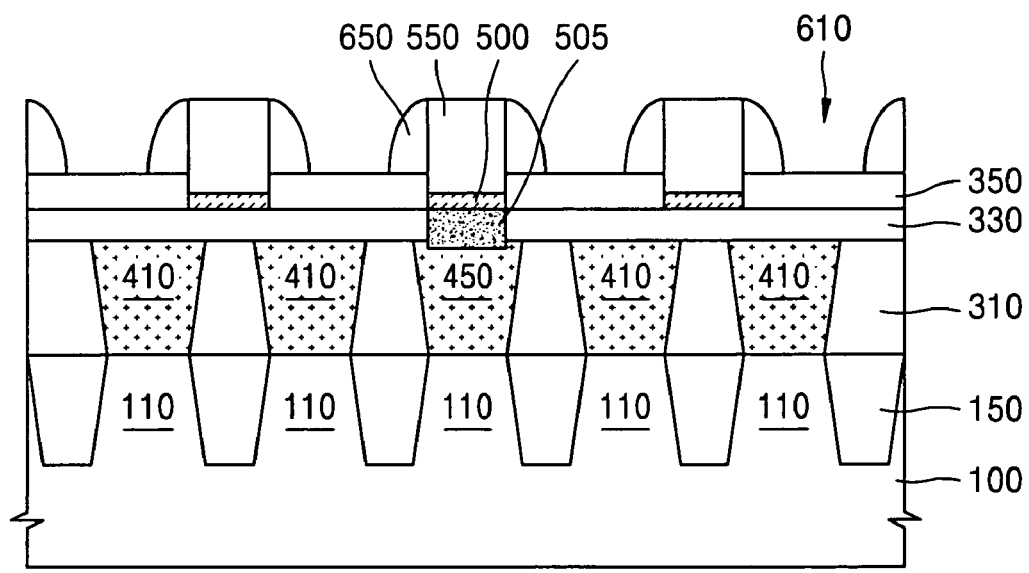
Figure 7F:
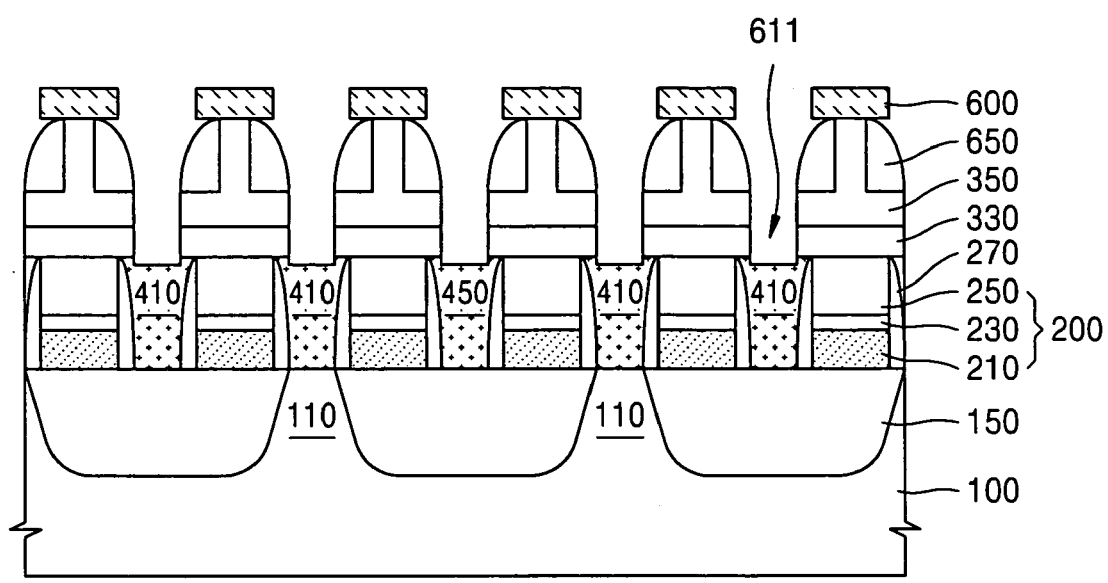
Figure 7G:
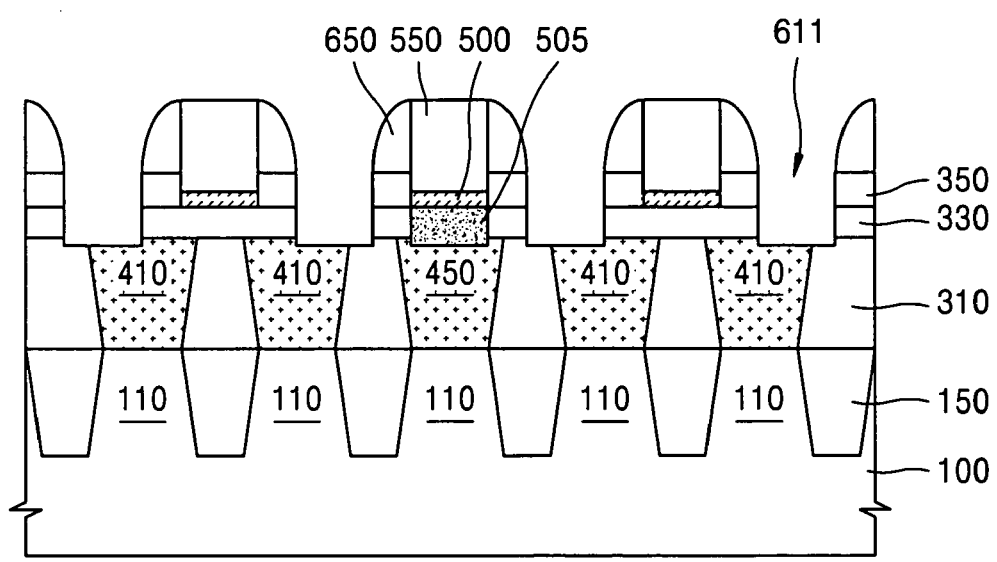

FIG. 7A is a plan view illustrating a process of forming third contact holes 611 exposing the first contact pads 410. FIGS. 7B and 7C are cross-sectional views taken along lines B–B' and W–W', respectively, of FIG. 7A in order to explain a process of forming opening regions or recessed portions 610 of a band type for forming the third contact holes 611. FIG. FIGS. 7D and 7E are cross-sectional views taken along lines B–B' and W–W', respectively, of FIG. 7A in order to explain a process of forming protection spacers 650 for forming the third contact holes 611. FIGS. 7F and 7G are cross-sectional views taken along lines B–B' and W–W', respectively, of FIG. 7A to explain the formation of the third contact holes 611.

Referring to FIGS. 7A through 7C, a hard mask layer is formed on the bit line capping insulating layer 550 and the third insulating layer 350 and patterned in a bar type to complete a hard mask 600.

The hard mask 600 is used as an etch mask when etching the third insulating layer 350 for BC storage contacts. Thus, the hard mask 600 is formed by depositing a material of a sufficient etch selectivity with respect to silicon oxide, which forms the third insulating layer 350 to a thickness of about 100 to 3,000 Å and can be polysilicon.

Here, the hard mask can be formed by photolithography using a photoresist pattern (not shown). After forming the hard mask layer, the photoresist pattern of opening areas in a band or bar type is formed exposing portions of the hard mask layer. Such photoresist pattern is formed to open the areas overlapped by the second contact pads 450.

Thereafter, the hard mask layer is patterned by using the photoresist pattern as an etch mask to form the hard mask 600 crossing the bit lines 500 with opening areas in the band or bar type, as shown in FIG. 7A. Here, the hard mask 600 may be formed to overlap the word lines 200.

The hard mask 600 is formed in the band type in order to secure a large photolithography process margin when forming a photoresist pattern for patterning the hard mask 600. As the design rule is reduced, it is difficult to simply form the storage node contacts which are the contact holes for the BC by using the resolution of a present photolithography process. Accordingly, it is helpful to introduce the band type hard mask 600 that has opening areas in the bar shape in order to overcome the resolution limit of the photolithography process.

The portions of the third insulating layer 350 exposed by the hard mask 600 are selectively etched along the bit line capping insulating layer 550. The bit line capping insulating layer 550 is formed of an insulating material such as silicon nitride having an etch selectivity with respect to the silicon oxide in the third insulating layer 350. Thus the bit line capping insulating layer 550 can operate as an etch stop layer.

Accordingly, when performing an etch process, the portions between the bands of the hard mask 600 and the portions between the bit lines 500 are etched and recessed. Such a selective etch is performed until exposing portions of the upper sidewalls of the bit line capping insulating layer 550. The etch process is referred to as a partial etch of the third insulating layer 350 to a predetermined thickness. It is preferable that the partial etch is performed so as not to expose the bit lines 500 by the recessed portion 610. Accordingly, the recessed portion 610 exposing the portions of the sidewalls of the bit line capping insulating layer 550 is formed in the third insulating layer 350.

The etch process is performed on the third insulating layer 350, and it is preferable that the bit line capping insulating layer 550 is formed to have the etch selectivity against silicon nitride.

Referring to FIGS. 7A, 7D, and 7E, after forming the recessed portion 610 with the partial etch, the protection spacers 650 covering the sidewalls of the bit line capping insulating layer 550 are formed by a spacer forming process in which a spacer layer is formed and anisotropically etched. The protection spacers 650 may be formed of a material having an etch selectivity against the insulating material forming the third insulating layer 350, e.g., silicon oxide. Such a material may be, for example, silicon nitride. In addition, the protection spacers 650 are formed to a thickness of about 10 to about 700 Å.

Preferably, the protection spacers 650 is thick enough to protect the bit lines 500 in a subsequent etch process. However, when the thickness of the protection spacers 650 is increased, the distance between adjacent protection spacers 650 is decreased. In order to prevent the decrease of the distance between the protection spacers 650, an additional etch process increasing the width of the recessed portion 610 may be performed before forming the protection spacers 650. Such additional etch process may be performed by an isotropic etch.

Such additional isotropic etch increases the width of the recessed portion 610. The etch process is performed with an etchant having an etch selectivity with respect to the silicon nitride that forms the bit line capping insulating layer 550. Accordingly, the bit line capping insulating layer 550 operates as an etch stop layer, and the third insulating layer 350 is etched more to increase the width of the recessed portion 610. Thus, an undercut shape expanding the recessed portions 610 under the hard mask 600 is obtained as shown in FIG. 7D.

After forming the spacer layer of covering the recessed portion 610, an anisotropic spacer etch is performed to form the protection spacers 650. The protection spacers 650 cover and protect the sidewalls of the bit line capping insulating layers 550 exposed by the recessed portion 610 and the sidewalls of the recessed portion 610 expanded under the hard mask 600 that is formed on the third insulating layer 350. Thus, the surfaces of the third insulating layer 350 forming the bottoms of the recessed portion 610 are exposed by the protection spacers 650.

The protection spacers 650 are formed while the recessed portions 610 expose the portions of the upper sidewalls of the bit line capping insulating layer 550. Thus the protection spacers 650 are formed as a top spacer type at the upper sidewalls of the bit line capping insulating layer 550.

Referring to FIGS. 7A, 7F, and 7G, the third contact holes 611 are formed to penetrate the third insulating layer 350 and the second insulating layer 330. More specifically, the portions of the third insulating layer 350 exposed by the protection spacers 650 which are the bottoms of the recessed portions 610, are etched by using the protection spacers 650 and the hard mask 600 as etch masks. The etch is continued to complete the third contact holes 611 exposing the upper surfaces of the first contact pads 410 through the third insulating layer 350 and the second insulating layer 330.

The protection spacers 650 are formed of silicon nitride and the hard mask 600 is formed of polysilicon It is known that polysilicon and silicon nitride may realize a sufficient etch selectivity against a silicon oxide layer forming the third insulating layer 350 or the second insulating layer 330. Accordingly, the protection spacers 650 and the hard mask 600 can operate as the etch masks.

The third insulating layer 350 and the second insulating layer 330 are etched by using the hard mask 600 and the protection spacers 650 as the etch masks. Thus the third contact holes 611 are self-aligned with the hard mask 600 and the protection spacers 650 and expose the upper surfaces of the first contact pads 410.

As shown in FIGS. 7F and 7G, the third contact holes 611 are separated from the second contact pads 450 by the second insulating layer 330 and the third insulating layer 350 remaining under the protection spacers 650. Accordingly, the width of the protection spacers 650 may be determined to secure the distance between the third contact holes 611 and the second contact pads 450. In addition, the third contact holes 611 are formed in a rectangle or an oval having a larger line width in the word line direction than in the bit line direction such that the third contact holes 611 are expanded in the word line direction.

Figure 8A:
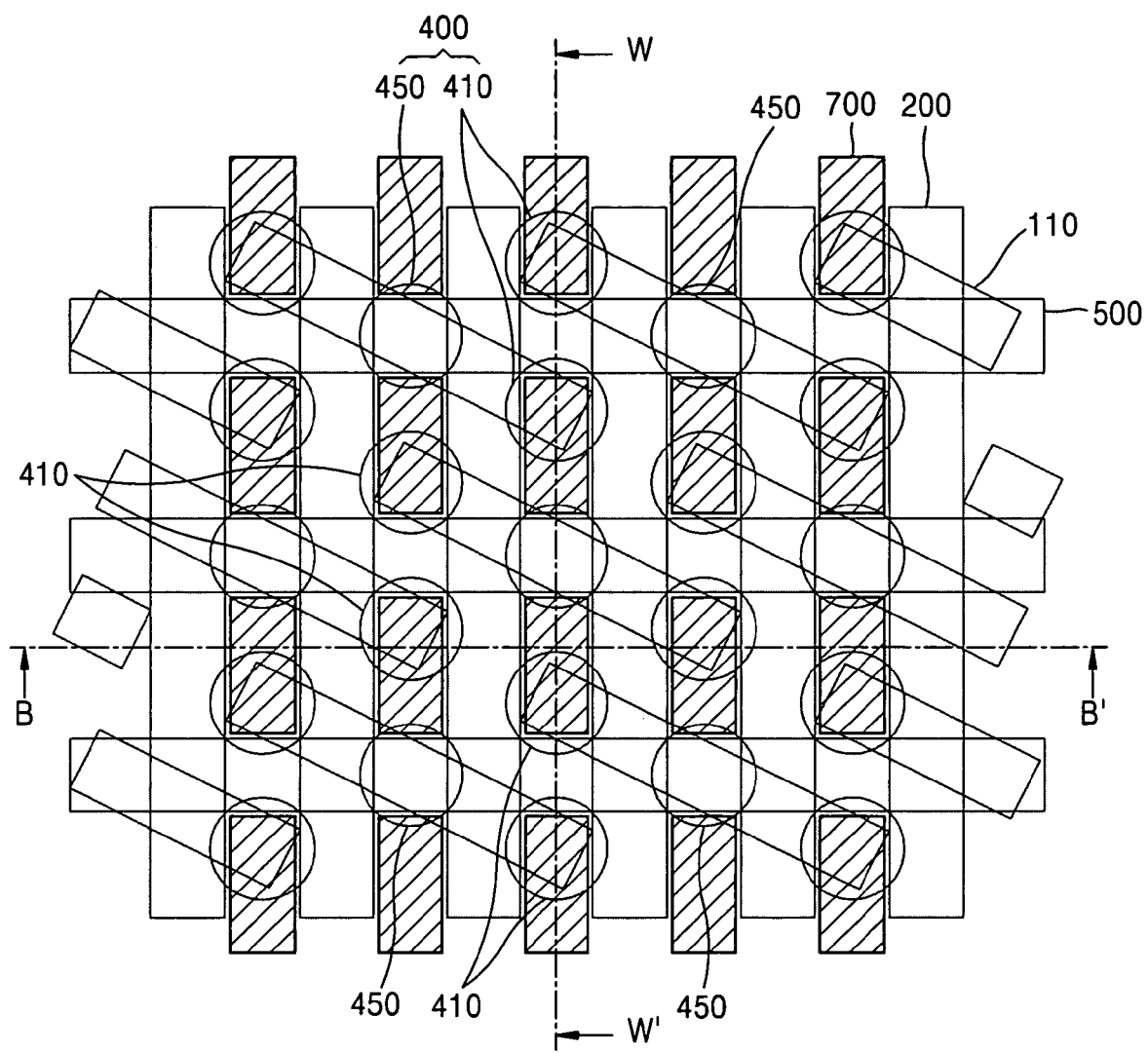
Figure 8B:
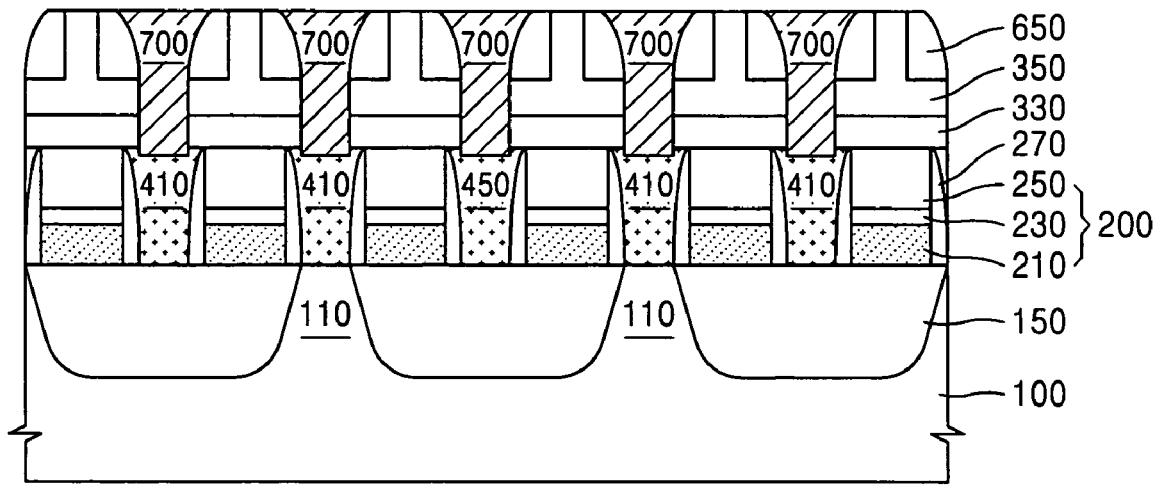
Figure 8C:
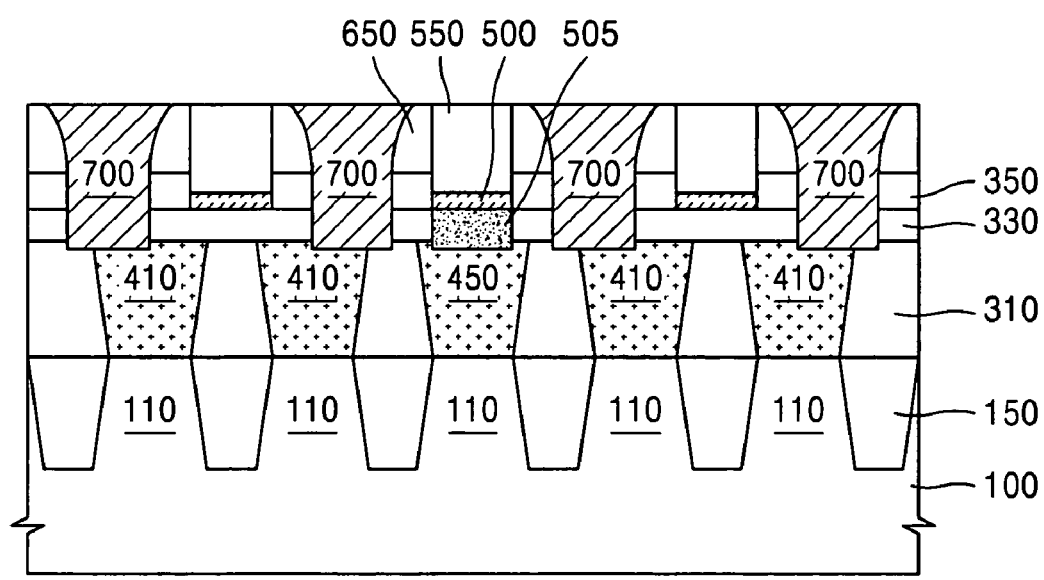

FIG. 8A is a plan view illustrating a state where storage node contacts 700 are formed. FIGS. 8B and 8C are cross-sectional views taken along lines B–B' and W–W', respectively, of FIG. 6A.

Referring to FIGS. 8A through 8C, the storage node contacts 700 electrically connected to the first contact pads 410 are formed by filling the third contact holes 611. More specifically, a conductive layer filling the third contact holes 611 is deposited and node separation is performed to complete the storage node contacts 700. Here, the conductive layer fills the third contact holes 611 to be electrically connected to the first contact pads 410, which are exposed to the third contact holes 611. Such a conductive layer may be formed of a conductive polysilicon layer. The conductive layer may be deposited while the hard mask 600 is still in place.

By performing the node isolation by planarizing the conductive layer, the storage node contacts 700 are patterned. Here, the planarization is performed by an etch back or a CMP in order to expose the upper surface of the bit line capping insulating layer 550. Accordingly, the conductive layer is isolated into individual storage node contacts 700. Since the hard mask 600 is formed of the polysilicon layer and the conductive layer is formed of the conductive polysilicon layer, the hard mask 600 may be removed in the planarization.

The storage node contacts 700 are formed in a rectangle having longer sides in the word line direction than the bit lines direction based on the shape of the third contact holes 611, as shown in FIG. 8A. Here, the storage node contacts 700 expand in the word line direction in order to secure sufficient contact areas between the storage node and the storage node contacts, even when the storage nodes deviate from the first contact pads 410. Accordingly, the storage node contacts 700 in the expanding shape prevent the increase of contact resistance between the first contact pads 410 because of the difference in the arrangement of the storage nodes.

In addition, the storage node contacts 700 are self-aligned with the protection spacers 650. Thus, the third insulating layer 350 formed of silicon oxide exists between the storage node contacts 700 and the bit lines 500, and the protection spacers 650 exist between the storage node contacts 700 and the bit line capping insulating layer 550.

Accordingly, the silicon oxide having a low dielectric constant exists around the bit lines 500 in order to effectively reduce a parasitic capacitance or a loading capacitance. In addition, the storage node contacts 700 are self-aligned in order to effectively prevent shorts between the bit lines 500 and the storage node contacts 700.

Figure 9A:
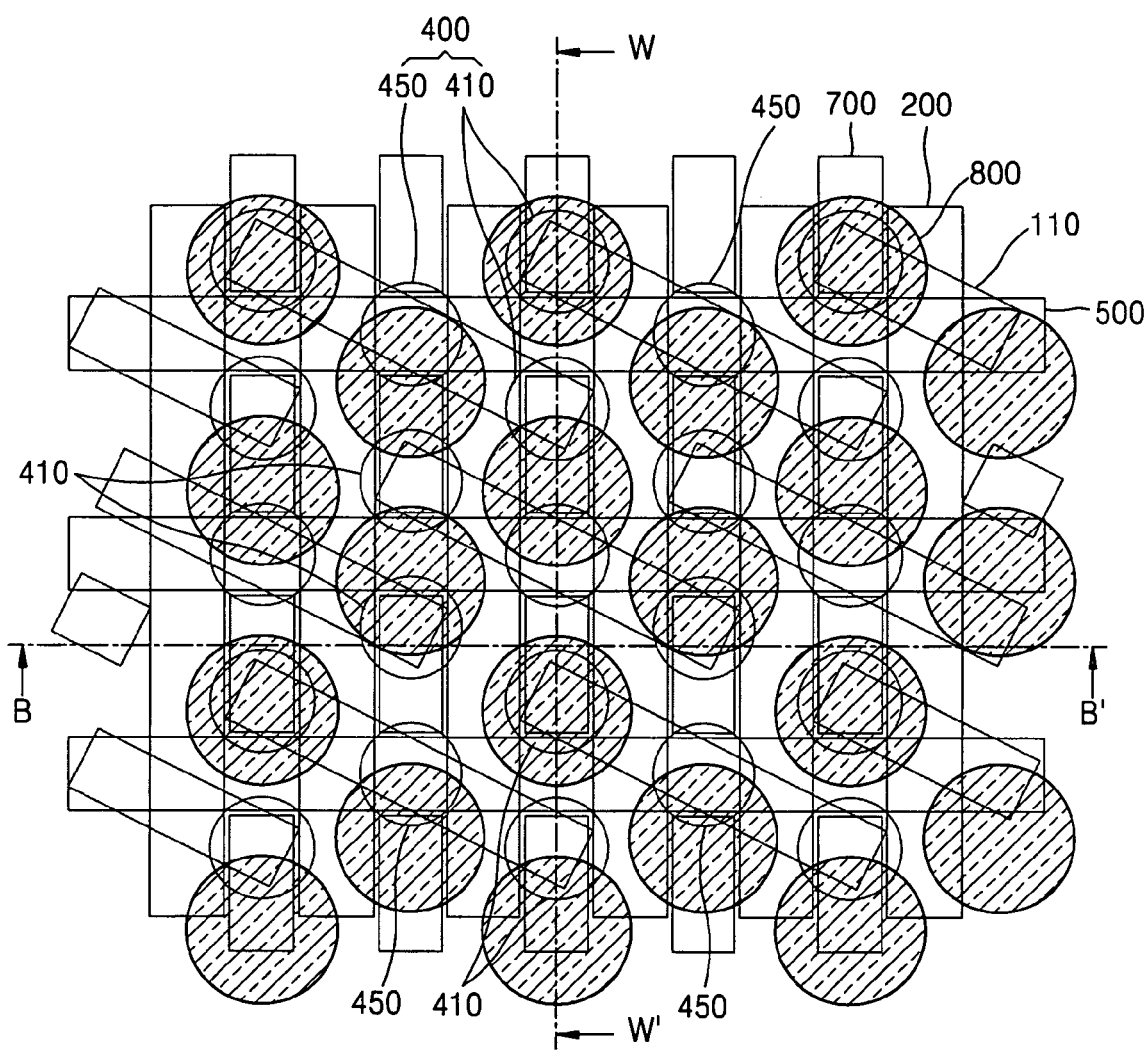
Figure 9B:
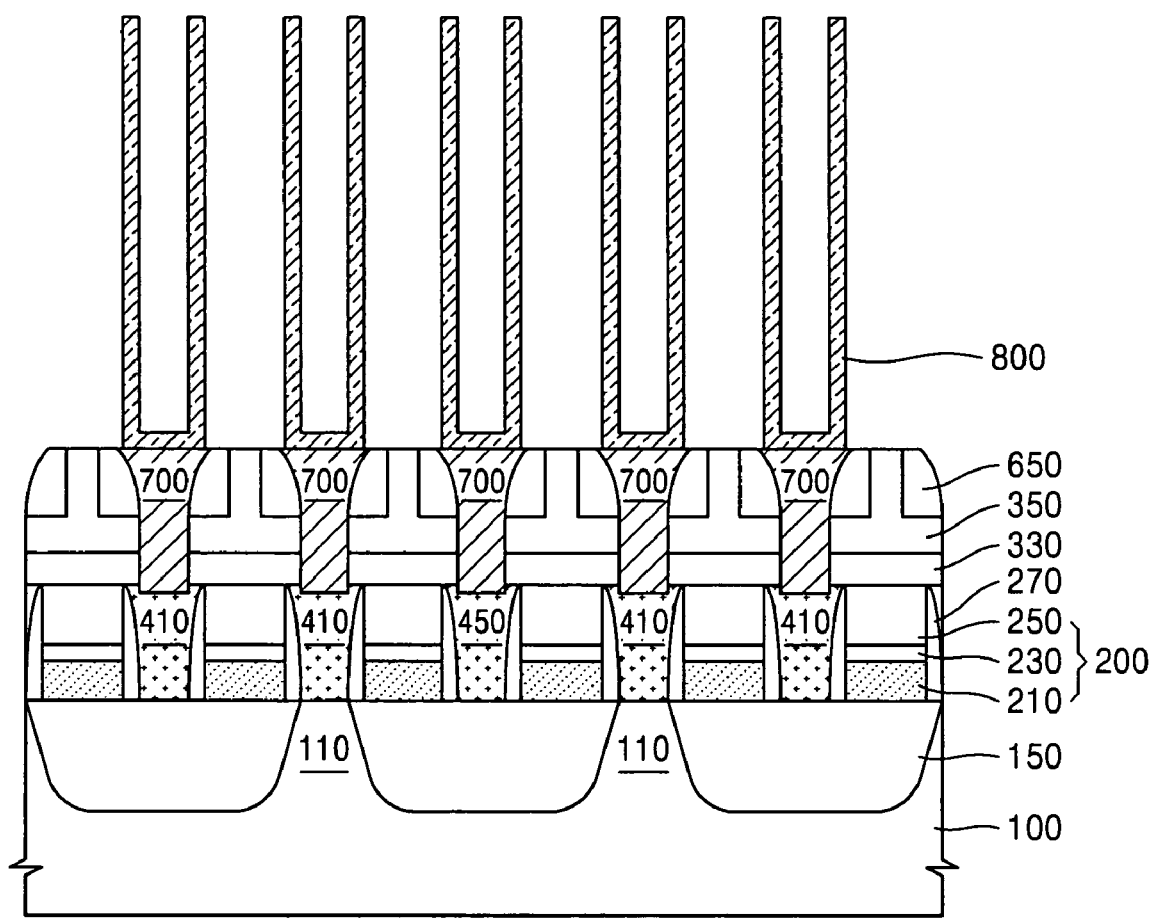
Figure 9C:
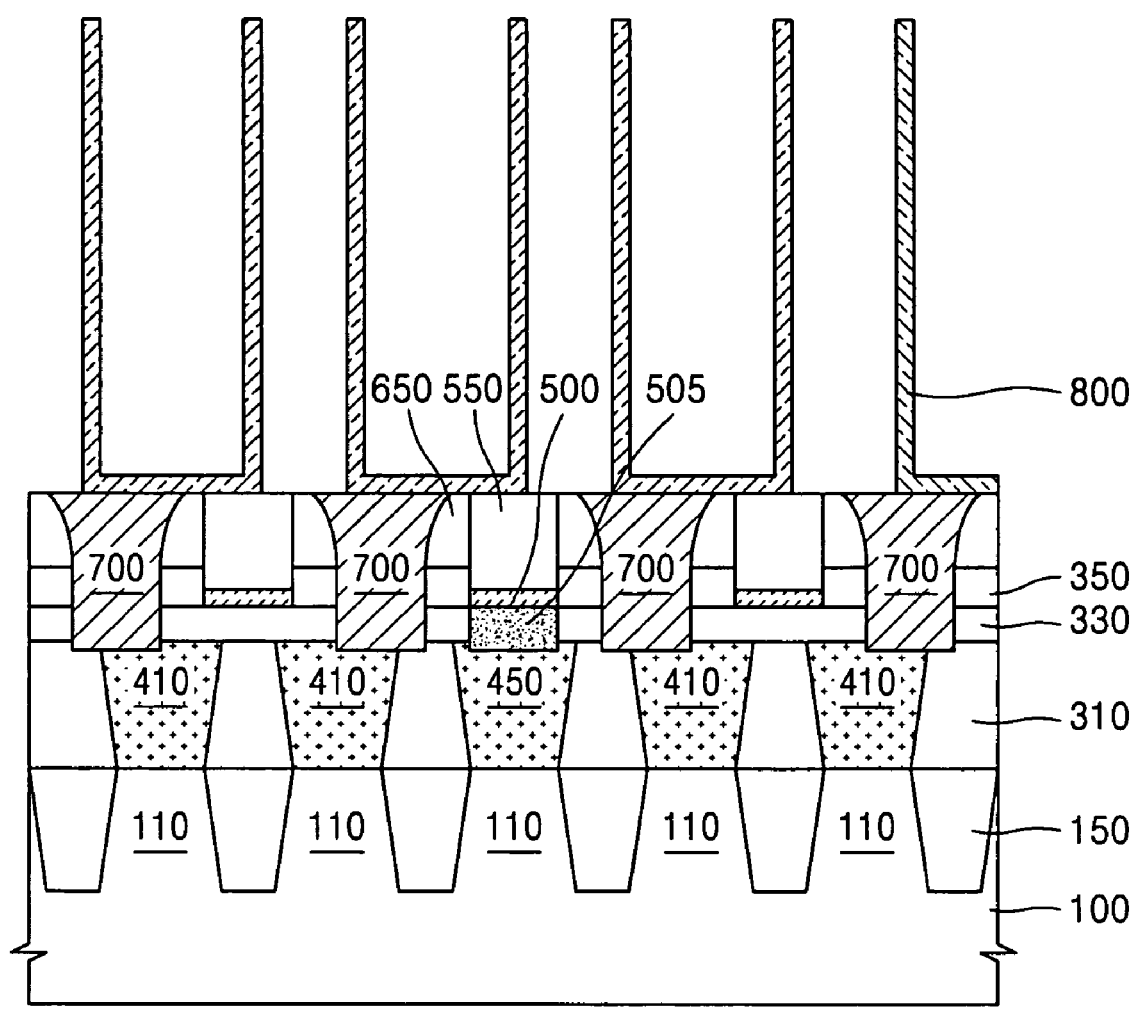

FIG. 9A is a plan view illustrating a state where the storage nodes 800 are formed. FIGS. 9B and 9C are cross-sectional views taken along lines B–B' and W–W', respectively, of FIG. 9A.

Referring to FIGS. 9A through 9C, the storage nodes 800, which are electrically connected to the storage node contacts 700 expanded in the word line direction, are formed. Such storage nodes 800 are zigzagged in the bit line direction, centering upon the bit lines 500. In other words, one storage node 800 is biased to the left side of the word line direction, and the next storage node 800 is biased to the right side of the word line direction. In addition, the storage nodes 800 overlap the word lines 200 and are arranged in lines along the word lines 200, in the word line direction. Thus, four adjacent storage nodes 800 form a lozenge, and the arrangement of the storage nodes 800 in a lozenge shape is repeated.

When the storage nodes 800 are zigzagged in the bit line direction, the centers of the storage nodes 800 and the first contact pads 410 deviate from each other. Such deviations of the centers decrease the overlapped area between the first contact pads 410 and the storage nodes 800 and may increase contact resistance.

The problem caused from the deviations of the centers is generated by biasing the storage nodes 800 in the word line direction. This problem can be solved by introducing the storage node contacts 700, which expand in the word line direction.

Since the storage node contacts 700 have a larger line width in the word line direction, larger areas of the storage node contacts 700 and the storage nodes 800, which are biased in the word line direction, are overlapped compared to the areas overlapped between the storage nodes 800 and the first contact pads 410. In addition, since the storage node contacts 700 are self-aligned between the bit lines 500 and the word lines 200, the storage node contacts 700 and the first contact pads 410, which are arranged between the word lines 200, are overlapped over large areas.

As described above, the problem of increasing the contact resistance due to the deviations between the first contact pads 410 and the storage nodes 800 is prevented by introducing the storage node contacts 700 expanding in the word line direction.

On the other hand, the storage nodes 800 may occupy a larger area, as described with reference to FIG. 2. Thus, the storage nodes 800 can provide a larger dielectric layer effective area to the capacitors including the storage nodes 800. As a result, the capacitance of the capacitors is increased, and the 6F2 cell structure of a cell structure transformed from the 6F2 cell structure can be applied to a memory device, such as a DRAM semiconductor device.

The storage nodes 800 can be formed in an OCS type, and the area occupied by the storage nodes 800 or the bottom of the storage nodes 800 may be formed in a square shape, such as a circle or a square, wherein the ratio between the X-axis and the Y-axis is 1:1. Even when the bottom of the storage nodes 800 is designed as a square, the storage nodes 800 may be a rounded square.

By forming the storage nodes 800 of the OCS type in the square shape, the distance between the storage nodes 800 is secured to prevent the generation of 2-bit errors caused from falls of the storage nodes.

In order for the storage nodes 800 to be formed in a three dimensional shape, such as a cylindrical shape, a mold (not shown) may be introduced as a sacrificial insulating layer. An additional node support layer or a buffer layer (not shown) may be introduced under the mold layer. A conductive layer covering the upper surfaces of the storage node contacts 700 is formed on the mold layer, and the node isolation is performed on the conductive layer to form the storage nodes 800.

A conductive auxiliary expansion pad can be optionally formed in order to reduce the contact resistance between the storage nodes 800 and the storage node contacts 700.

FIGS. 10A through 12 illustrate examples of the method of manufacturing a semiconductor device using the square type storage nodes according to another embodiment of the present invention.

Figure 10A:
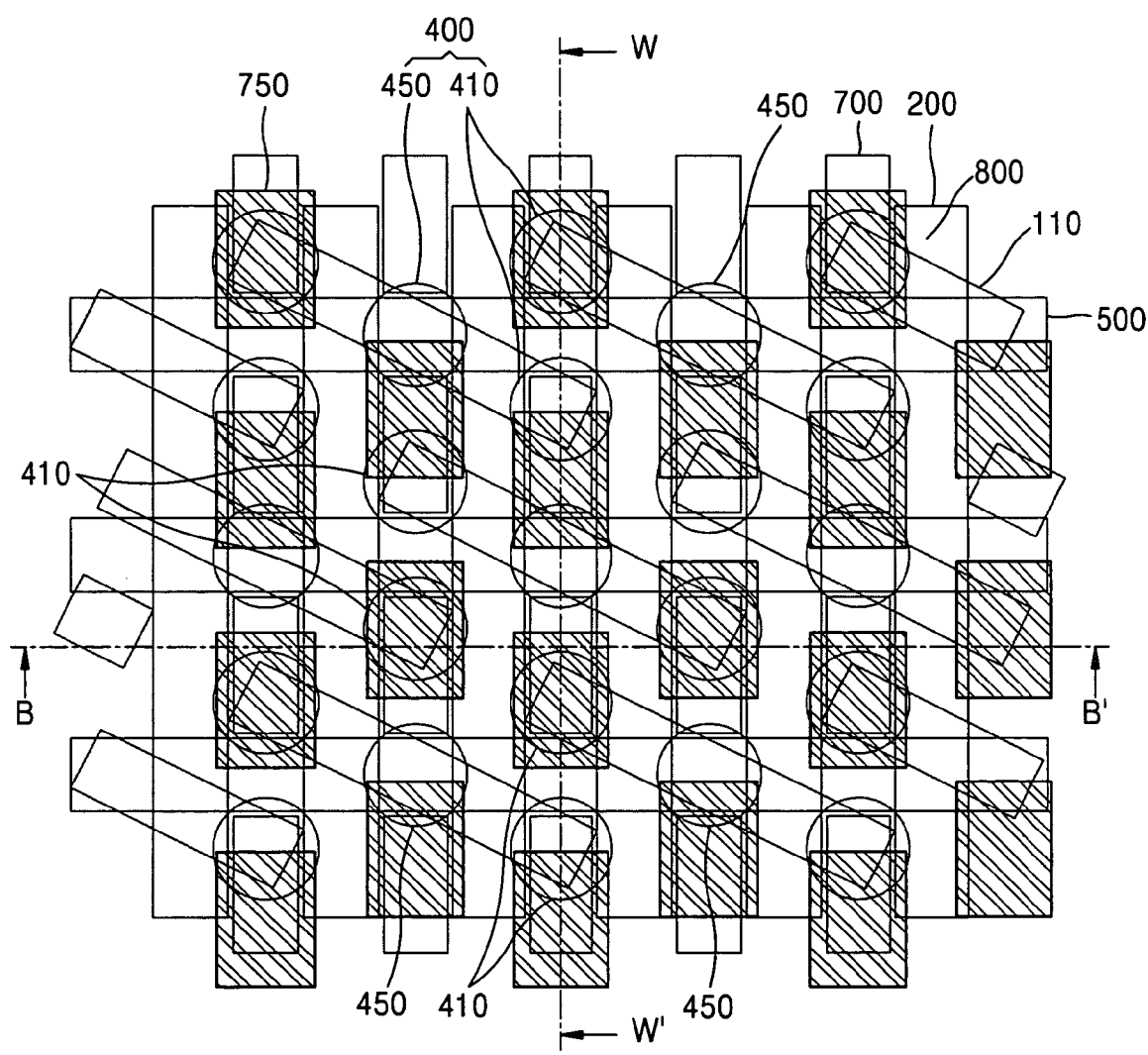
FIGS. 10A through 12 illustrate examples of the method of manufacturing a semiconductor device using the square type storage nodes of FIG. 2.
Figure 10B:
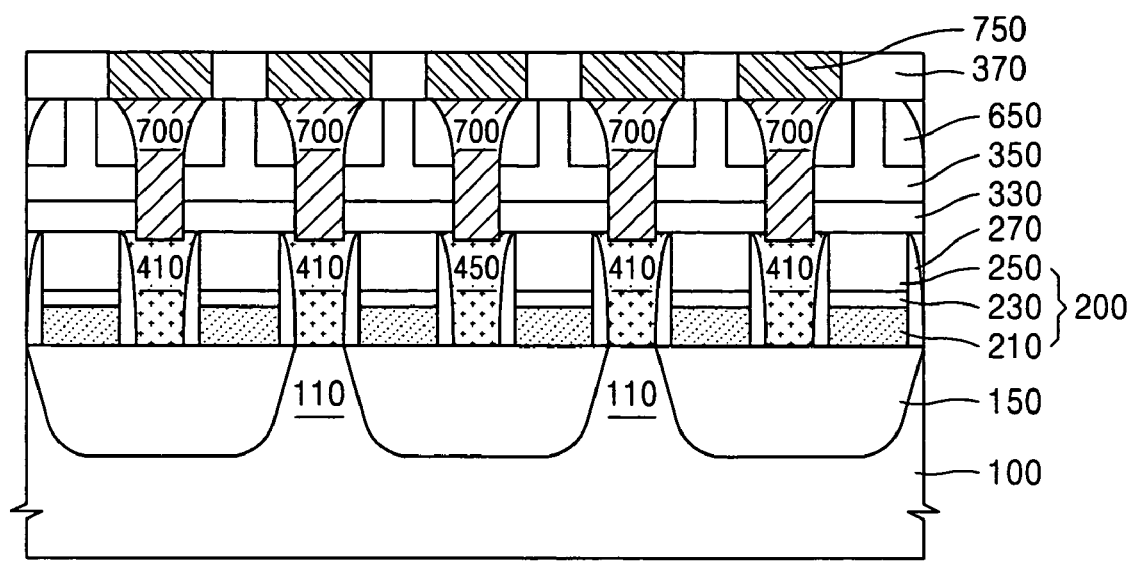
Figure 10C:
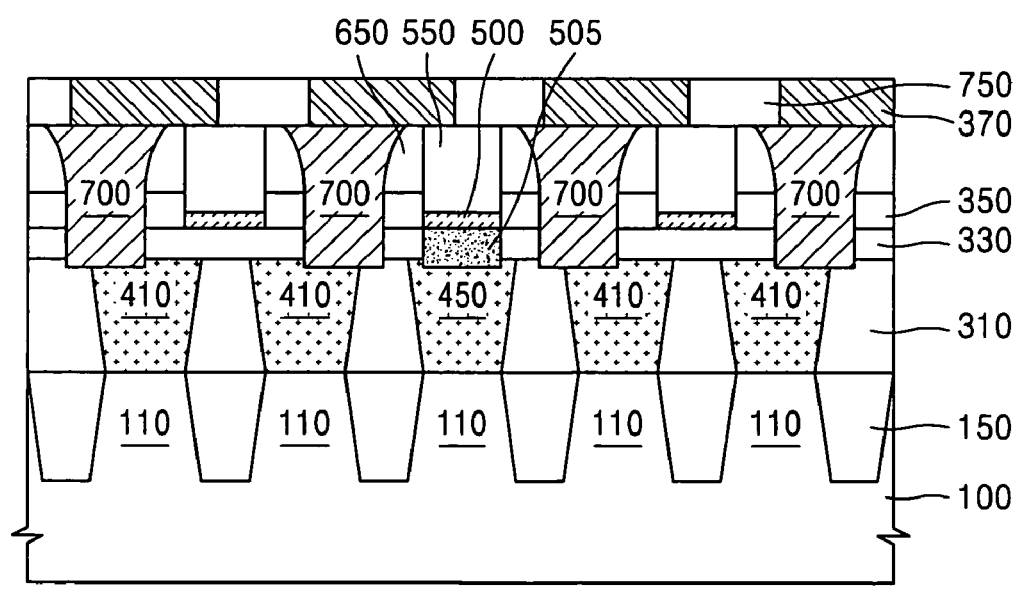

FIG. 10A is a plan view illustrating a state where auxiliary expansion pads 750 are formed. FIGS. 10B and 10C are cross-sectional views taken along lines B–B' and W–W', respectively, of FIG. 10A.

Referring to FIGS. 10A through 10C, a fourth insulating layer 370 covering the storage node pads 700 and the third insulating layer 350 is formed, and fourth contact holes exposing the storage node pads 700 are formed by a photolithography process. Then, auxiliary expansion pads 750 filling the fourth contact holes to be electrically connected to the storage node pads 700 are formed. Here, the auxiliary expansion pads 750 overlap the bit lines 500 by expanding in the word line direction compared to the storage node pads 700.

Two auxiliary expansion pads 750, which are adjacent centering upon the word lines 200, expand in the opposite directions to each other. Such auxiliary expansion pads 750 are expanded toward the bit lines 500 more than the storage node contacts 700 to overlap the bit lines 500. Accordingly, the auxiliary expansion pads 750 increase the contact areas between the storage nodes 800, which are biased in the word line direction, and the storage node contacts 700, which are located between the bit lines 500.

Figure 11A:
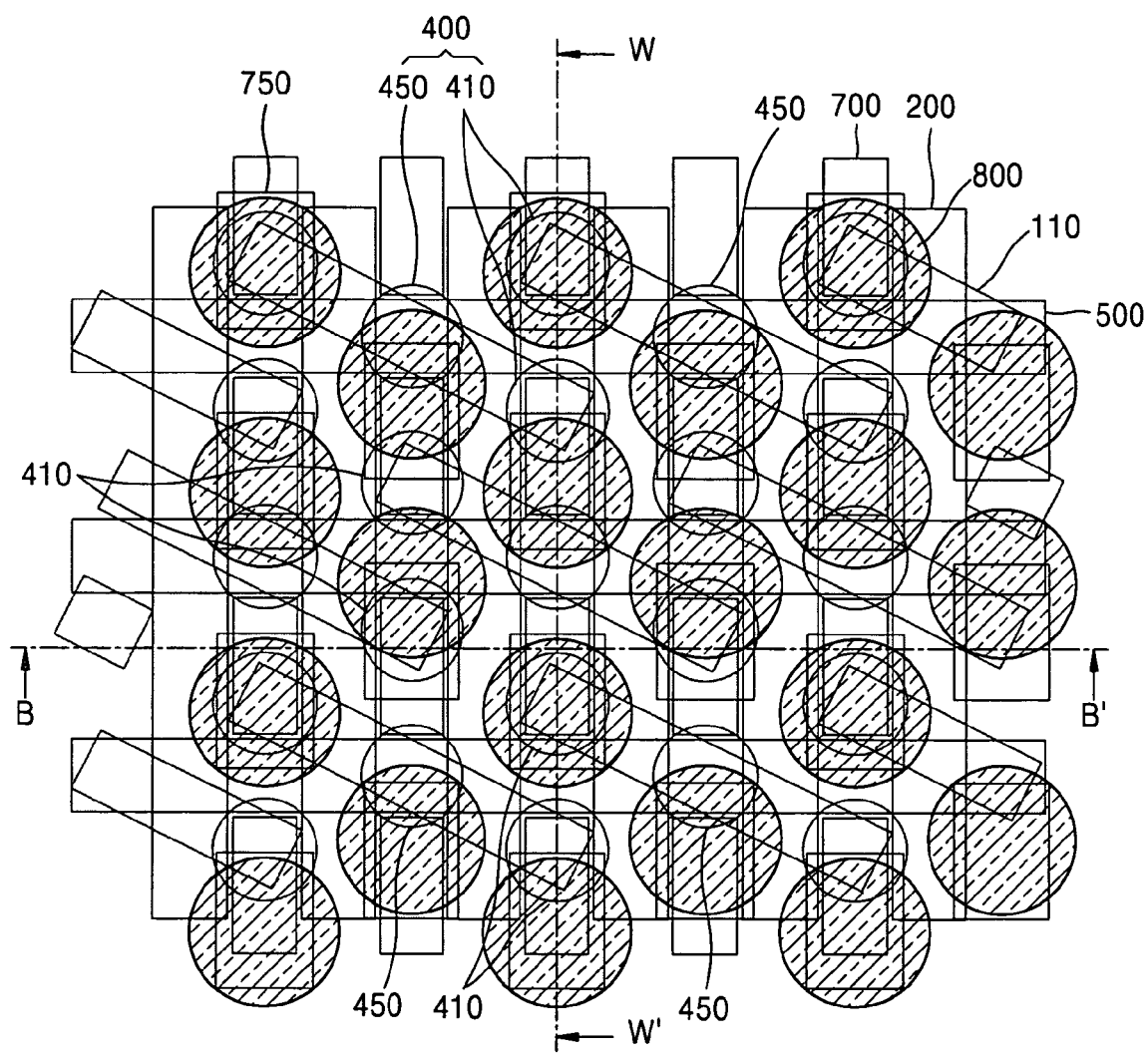
Figure 11B:
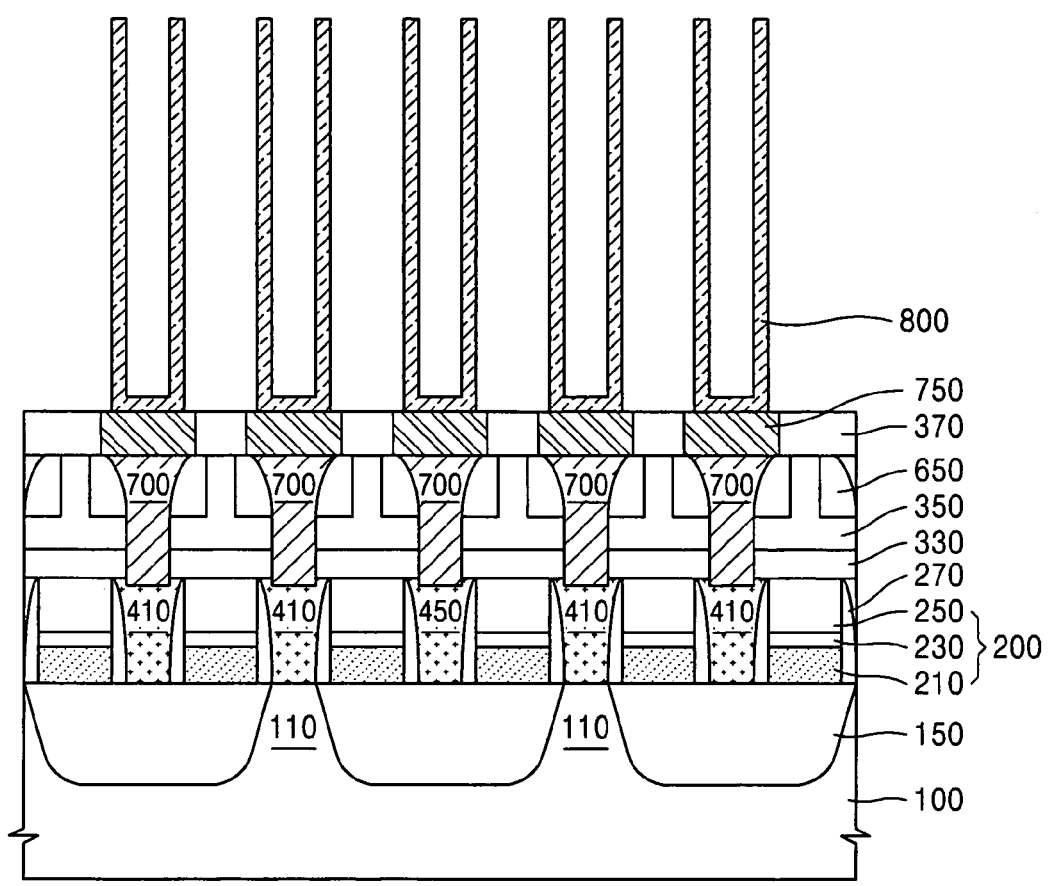
Figure 11C:
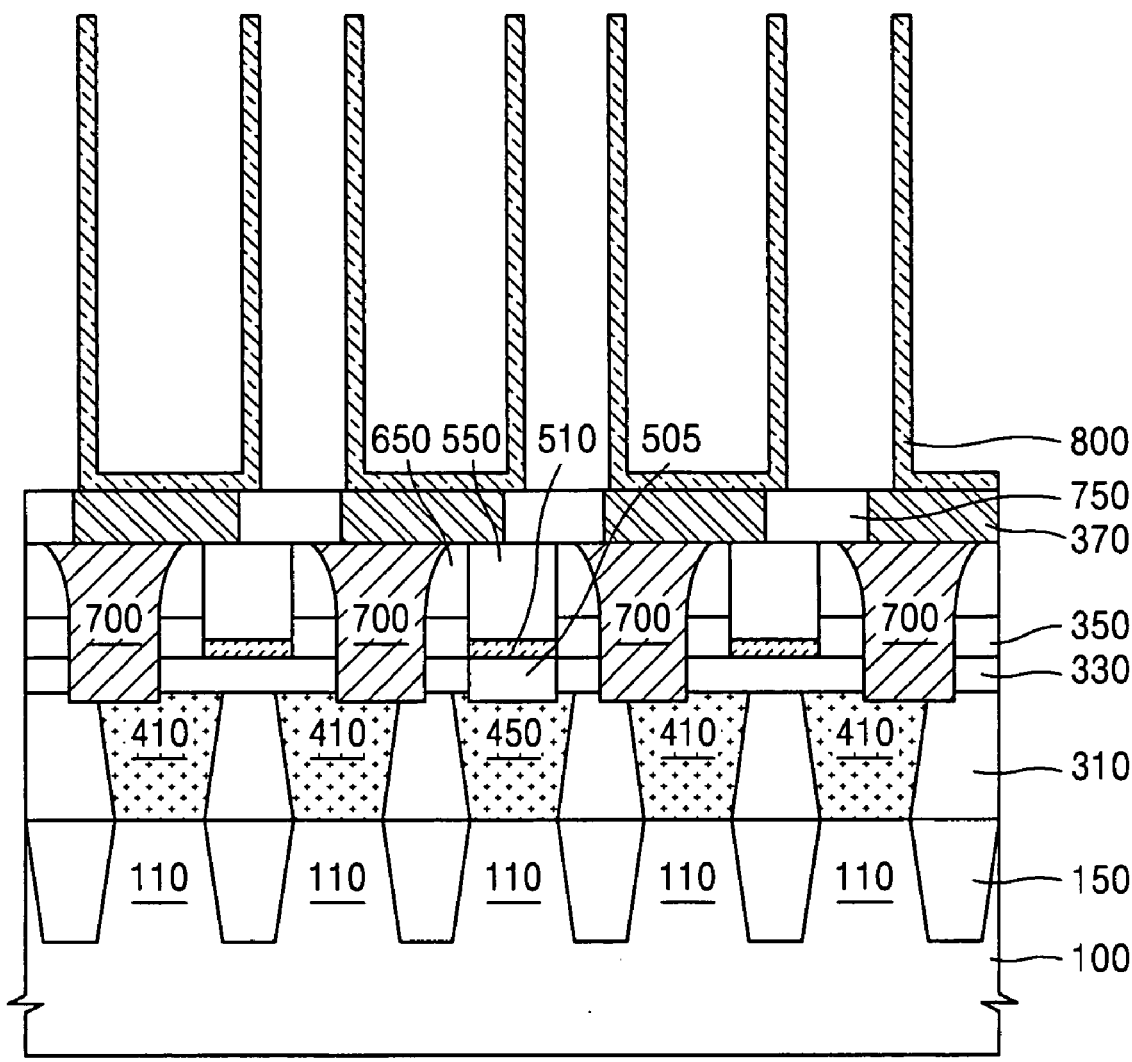

FIG. 11A is a plan view illustrating a state where the storage nodes 800 are formed on the auxiliary expansion pads 750. FIGS. 11B and 11C are cross-sectional views taken along lines B–B' and W–W', respectively, of FIG. 11A.

Referring to FIGS. 11A through 11C, the storage nodes 800 are formed to overlap the auxiliary expansion pads 750. Thus, contact resistance between the storage nodes 800 and the storage node contacts 700 can be reduced.

Figure 12:
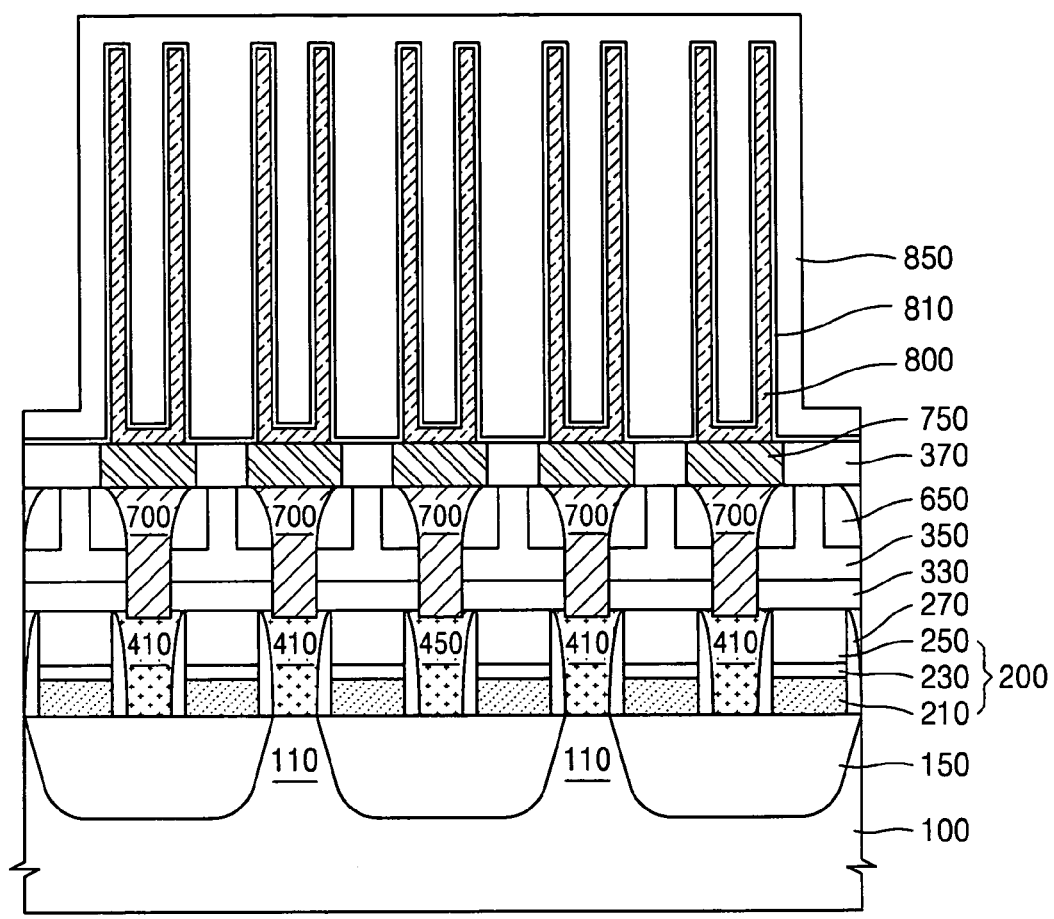

FIG. 12 is a cross-sectional view illustrating a memory device in which capacitors are formed.

Referring to FIG. 12, a dielectric layer 810 is formed on the storage nodes 800, and a plate node 850 is formed thereon to complete capacitors. The storage nodes 800 of such capacitors may secure a large area, thus the stack height of the storage nodes 800 can be increased. Accordingly, the effective surface area of the dielectric layer 810 is increased, and the capacitance of the capacitors is increased.

As described above, the area occupied by the storage nodes of the capacitors is increased by about 30% compared to conventional techniques when composing the capacitors in the 6F² cell structure or a cell structure transformed therefrom, which can reduce the cell area compared to the 8F2 cell structure. Thus, the capacitance of the capacitors is increased.

Accordingly, the 6F² cell structure of the 6.6F2 cell structure can be applied to a memory device, such as a DRAM semiconductor device. As a result, the cell of a memory semiconductor device is reduced and stable operation is realized.

While the present invention has been particularly shown and described with reference to an exemplary embodiment thereof, it will be understood by those of ordinary skill in the art that various changes in form and details may be made therein without departing from the spirit and scope of the present invention as defined by the following claims.

What is claimed is:

1. A semiconductor device, comprising:
   word lines formed on a semiconductor substrate in a word line direction;
   bit lines formed on the semiconductor structure in a bit line direction, wherein the bit lines are separated from the word lines and the bit line direction is perpendicular to the word lines;
   active regions defined on the semiconductor substrate, wherein the active regions have a major axis slanted to the word lines direction and to the bit line direction;
   capacitor storage nodes arranged in a line in the word line direction overlapping the word lines and arranged in a zigzag pattern in the bit line direction, the zigzag pattern centered on the bit lines; and
   storage node contacts electrically connecting the active regions with the capacitor storage nodes, wherein the storage node contacts are self-aligned with the bit lines, separated from each other by the word lines, have a width in the word line direction larger than in the bit line direction, and overlap areas of the capacitor storage nodes.

2. The semiconductor device of claim 1, wherein the storage nodes are arranged to overlap areas between the word lines and the bit lines.

3. The semiconductor device of claim 1, further comprising auxiliary expansion pads arranged to overlap the storage node contacts and to electrically connect the storage node contacts to the storage nodes, wherein the auxiliary expansion pads extend in the word line direction relative to the storage node contacts to overlap larger areas of the storage nodes.

4. The semiconductor device of claim 3, wherein the auxiliary expansion pads extend in the word line direction to partially overlap the bit lines.

5. The semiconductor device of claim 1, wherein a pitch between the word lines is twice a minimum line width pitch F, and a pitch between the bit lines is larger than twice the minimum line width pitch F and smaller than four times the minimum line width pitch F.

6. The semiconductor device of claim 5, wherein the pitch between the bit lines is one of three times and 3.3 times the minimum line width pitch F.

7. The semiconductor device of claim 1, wherein the storage nodes are formed in a one cylindrical stack (OCS) type.

8. The semiconductor device of claim 1, wherein an area occupied by the storage nodes has a square shape having a ratio of an X-axis and a Y-axis of about 1:1.

9. A semiconductor device, comprising:
   word lines formed on a semiconductor substrate in a word line direction;
   bit lines formed on the semiconductor structure in a bit line direction, wherein the bit lines are separated from the word lines and the bit line direction is perpendicular to the word lines;
   active regions defined on the semiconductor substrate, wherein the active regions have a major axis slanted to the word lines direction and to the bit line direction;
   a first insulating layer insulating spaces between the word lines;
   first and second contact pads contacting the active regions between the word lines by penetrating the first insulating layer and self-aligning to the word lines;
   a second insulating layer insulating the space between the bit lines and the word lines;
   bit line contacts electrically connecting the bit lines to the second contact pads by penetrating the second insulating layer;
   capacitor storage nodes arranged in a line in the word line direction overlapping the word lines and arranged in a zigzag pattern in the bit line direction, the zigzag pattern centered on the bit lines;
   a bit line capping insulating layer on the bit lines in an interlayer between the bit lines and capacitor storage nodes and self-aligned with the bit lines;
   protection spacers for on upper sidewalls of the bit line capping insulating layer;
   a third insulating layer covering a remaining portion of the sidewalls of the bit line capping insulating layer filling the spaces between the bit lines to separate the bit lines; and
   storage node contacts electrically connecting the first contact pads to the capacitor storage nodes through the third insulating layer, wherein the storage node contacts are aligned with the bit lines by the protection spacers and separated from each other by the bit line capping insulating layer, have a width in the word line direction longer than in the bit line direction, and overlap areas of the capacitor storage nodes.

10. The semiconductor device of claim 9, further comprising:
a fourth insulating layer formed on the third insulating layer; and
auxiliary expansion pads penetrating the fourth insulating layer and overlapping the storage node contacts to electrically connect the storage node contacts to the capacitor storage nodes,
wherein the auxiliary expansion pads extend in the word line direction farther than the storage node contacts to overlap large areas of the capacitor storage nodes than the storage node contacts.

11. The semiconductor device of claim 10, wherein the auxiliary expansion pads extend in the word line direction to partially overlap the bit lines.

12. The semiconductor device of claim 9, wherein the protection spacers partially extend to an interface of the third insulating layer between the storage node contacts and extend to the storage node contacts in the bit line direction to self-align the storage node contacts with the protection spacers.

13. The semiconductor device of claim 9, wherein the storage nodes are formed in an OCS type.

14. The semiconductor device of claim 9, wherein an area occupied by the storage nodes has a square shape having a ratio of an X-axis and a Y-axis of about 1:1.

15. A method of manufacturing a semiconductor device, the method comprising:
forming word lines on a semiconductor substrate aligned in a word line direction;
forming bit lines separated from the word lines and aligned in a bit line direction perpendicular to the word line direction;
defining active regions on the semiconductor substrate, wherein the active regions have a major axis slanted to the word line direction and bit line direction;
forming capacitor storage nodes in a line in the word line direction overlapping the word lines and in a zigzag pattern in the bit line direction, the zigzag pattern centered on the bit line; and
forming storage node contacts to electrically connect the active regions with the capacitor storage nodes, wherein forming the storage node contacts includes self-aligning the storage node contacts to the bit lines with a width in the word line direction larger than in the bit line direction and separating the storage node contacts from each other by the word lines.

16. The method of claim 15, wherein forming the storage node contacts includes arranging the storage node contacts to overlap an area between the word lines and the bit lines.

17. The method of claim 15, further comprising forming auxiliary expansion pads, wherein forming the auxiliary expansion pads includes arranging the auxiliary expansion pads to overlap the storage node contacts to electrically connect the storage node contacts with the capacitor storage nodes and securing an area overlapping the storage nodes by extending the auxiliary expansion pads in the word line direction.

18. The method of claim 17, wherein forming the auxiliary expansion pads includes extending the auxiliary expansion pads in the word line direction to partially overlap the bit lines.

19. The method of claim 15, wherein forming the capacitor storage nodes includes forming the capacitor storage nodes in an OCS type.

20. The method of claim 15, wherein forming the capacitor storage nodes includes arranging the capacitor storage nodes to occupy an area that has a square shape having a ration of an X-axis and a Y-axis of about 1:1.

21. A method of manufacturing a semiconductor device, the method comprising:
forming word lines on a semiconductor substrate aligned in a word line direction;
forming bit lines separated from the word lines and aligned in a bit line direction perpendicular to the word line direction;
defining active regions on the semiconductor substrate, wherein the active regions have a major axis slanted to the word line direction and bit line direction;
forming a first insulating layer of insulating spaces between the word lines;
forming first contact pads and second contact pads that contact the active regions between the word lines by penetrating the first insulating layer;
forming a second insulating layer of insulating spaces between the bit lines and the word lines;
forming bit contact lines that electrically connect the bit lines to the second contact pads by penetrating the second insulating layer;
forming capacitor storage nodes in a line in the word line direction overlapping the word lines and in a zigzag pattern in the bit line direction, the zigzag pattern centered on the bit lines;
forming a bit line capping insulating layer in an interlayer between the bit lines and the capacitor storage nodes, on the bit lines, wherein forming the bit line capping insulating layer includes self-aligning the bit line capping insulating layer to the bit lines;
forming a third insulating layer of insulating spaces between the bit line capping insulating layer and the bit lines;
forming a hard mask of a band type on the third insulating layer to overlap the word lines, extend in the word line direction and cross the bit line capping insulating layer;
forming recessed portions on the third insulating layer to partially expose sidewalls of the bit line capping insulating layer by etching the third insulating layer to a predetermined depth using the hard mask as an etch mask;
forming protection spacers on sidewalls of the recessed portions including upper sidewalls of the bit line capping insulating layer and sidewalls of the third insulating layer;
forming contact holes exposing upper surfaces of the first contact pads through the third insulating layer and second insulating layer by etching bottoms of the recessed portions exposed through the protection spacers by using the protection spacers as an etch mask;
forming a conductive layer filling the contact holes; and
forming storage node contacts electrically connecting to the first contact pads by planarizing the conductive layer until an upper surface of the bit line capping insulating layer is exposed, wherein forming the storage node contacts includes aligning the storage node contacts to the bit lines by the protection spacers with a width in the word line direction larger than in the bit line direction, separating the storage node contacts from each other by the word lines, and overlapping an area over the capacitor storage nodes.

22. The method of claim 21, further comprising:
forming a fourth insulating layer on the third insulating layer; and
forming auxiliary expansion pads by penetrating the fourth insulating layer and overlapping the storage node contacts to electrically connect the storage node contacts to the capacitor storage nodes, wherein forming the auxiliary expansion pads includes overlapping areas of the capacitor storage nodes by extending the auxiliary expansion pads in the word line direction farther than the storage node contacts.

23. The method of claim 22, wherein forming the auxiliary expansion pads includes extending the auxiliary expansion pads in the word line direction to partially overlap the bit lines.

24. The method of claim 21, wherein forming the hard mask includes forming the hard mask of a polysilicon layer to realize an etch selectivity against the bit line capping insulating layer, the protection spacers, and the second and third insulating layers.

25. The method of claim 21, wherein forming the bit line capping insulating layer includes depositing the bit line capping insulating layer on a layer for the bit lines before patterning the bit lines and patterning the bit line capping insulating layer when patterning the bit lines to align the bit line capping insulating layer with the bit lines.

26. The method of claim 21, further comprising performing an etch before forming the protection spacers to increase a width of the recessed portions.

27. The method of claim 21, wherein forming the capacitor storage nodes includes forming the capacitor storage nodes in an OCS type.

28. The method of claim 21, wherein forming the capacitor storage nodes includes arranging the capacitor storage nodes to occupy an area that has a square shape having a ration of an X-axis and a Y-axis of about 1:1.

29. The method of claim 21, wherein forming the word lines includes forming the word lines at a pitch that is twice a minimum line width pitch F,
and forming the bit lines includes forming the bit lines at a pitch that is larger than twice the minimum line width pitch F and smaller than four times the minimum line width pitch F.

30. The method of claim 29, wherein forming the bit lines includes forming the bit lines at a pitch that is one of three times and 3.3 times the minimum line width pitch F.

31. A method of manufacturing a semiconductor device, comprising:
defining active regions on a semiconductor substrate;
forming word lines across the active regions of the semiconductor substrate in a direction slanted to a major axis of the active regions;
forming a first insulating layer of insulating spaces between the word lines;
forming first contact pads and second contact pads that contact the active regions between the word lines by penetrating the first insulating layer and self-aligning to the word lines;
forming a second insulating layer on the first insulating layer, the second insulating layer covering the first and second contact pads;
forming bit line contacts aligned to the second contact pads through the second insulating layer;
forming bit lines and a bit line capping insulating layer by sequentially forming and patterning a bit line layer on the second insulating layer to electrically connect the bit lines to the bit line contacts and to the bit line capping insulating layer, wherein forming bit lines includes separating the bit lines from the word lines and forming the bit lines perpendicular to the word lines;
forming a third insulating layer to fill a space between the bit lines and the bit line capping insulating layer;
forming a hard mask of a band type on the third insulating layer, wherein forming the hard mask includes overlapping the word lines and extending the mask in the word line direction and thereby crossing the bit line capping insulating layer;
forming recessed portions on the third insulating layer to partially expose sidewalls of the bit line capping insulating layer by etching the third insulating layer to a predetermined depth using the hard mask as an etch mask;
forming protection spacers on sidewalls of the recessed portions including upper sidewalls of the bit line capping insulating layer and sidewalls of the third insulating layer;
forming contact holes exposing upper surfaces of the first contact pads through the third insulating layer and the second insulating layer by etching bottoms of the recessed portions exposed through the protection spacers using the protection spacers as etch mask;
forming a conductive layer filling the contact holes;
forming storage node contacts by planarizing the conductive layer until an upper surface of the bit line capping insulating layer is exposed, wherein forming the storage node contacts includes:
electrically connecting the storage node contacts to the first contact pads,
overlapping the spaces between the word lines,
aligning the storage node contacts using the protection spacers, and
creating a larger line width in the word line direction than in the bit line direction by separating each storage node contact from each other using the bit line capping insulating layer;
forming capacitor storage nodes on the third insulating layer and on the bit line capping insulating layer, wherein forming the capacitor storage nodes includes arranged the capacitor storage nodes in lines along the word lines and overlapping the word lines, arranging the capacitor storage nodes in a zigzag pattern centering upon the bit lines along the bit lines, and electrically connecting the capacitor storage nodes to the storage node contacts; and
forming a dielectric layer and a plate node on the capacitor storage nodes.

32. The method of claim 31, wherein forming the recessed portions includes performing an etch to increase the width of the recessed portions before forming the protection spacers.

33. A method of manufacturing a semiconductor device, comprising:
defining active regions on a semiconductor substrate;
forming word lines across the active regions of the semiconductor substrate in a direction slanted to a major axis of the active regions;
forming a first insulating layer of insulating spaces between the word lines;
forming first contact pads and second contact pads that contact the active regions between the word lines by penetrating the first insulating layer and self-aligning to the word lines;
forming a second insulating layer on the first insulating layer, the second insulating layer covering the first and second contact pads;

forming bit line contacts aligned to the second contact pads through the second insulating layer;

forming bit lines and a bit line capping insulating layer by sequentially forming and patterning a bit line layer on the second insulating layer to electrically connect the bit lines to the bit line contacts and to the bit line capping insulating layer, wherein forming bit lines includes separating the bit lines from the word lines and forming the bit lines perpendicular to the word lines;

forming a third insulating layer to fill a space between the bit lines and the bit line capping insulating layer;

forming a hard mask of a band type on the third insulating layer, wherein forming the hard mask includes overlapping the word lines and extending the mask in the word line direction and thereby crossing the bit line capping insulating layer;

forming recessed portions on the third insulating layer to partially expose sidewalls of the bit line capping insulating layer by etching the third insulating layer to a predetermined depth using the hard mask as an etch mask;

forming protection spacers on sidewalls of the recessed portions including upper sidewalls of the bit line capping insulating layer and sidewalls of the third insulating layer;

forming contact holes exposing upper surfaces of the first contact pads through the third insulating layer and the second insulating layer by etching bottoms of the recessed portions exposed through the protection spacers using the protection spacers as etch mask;

forming a conductive layer filling the contact holes;

forming storage node contacts by planarizing the conductive layer until an upper surface of the bit line capping insulating layer is exposed, wherein forming the storage node contacts includes:

electrically connecting the storage node contacts to the first contact pads, overlapping the spaces between the word lines, aligning the storage node contacts using the protection spacers, and creating a larger line width in the word line direction than in the bit line direction by separating each storage node contact from each other using the bit line capping insulating layer;

forming a fourth insulating layer on the third insulating layer;

forming auxiliary expansion pads by penetrating the fourth insulating layer and overlapping the storage node contacts, wherein forming the auxiliary expansion pads includes extending the auxiliary expansion pads in the word line direction to the bit lines farther than the storage node contacts and extending the auxiliary expansion pads in an opposite direction from an adjacent auxiliary expansion pad;

forming capacitor storage nodes on the fourth insulating layer, wherein forming the capacitor storage nodes includes arranged the capacitor storage nodes in lines along the word lines and overlapping the word lines, arranging the capacitor storage nodes in a zigzag pattern centering upon the bit lines along the bit lines, and electrically connecting the capacitor storage nodes to the auxiliary expansion pads; and forming a dielectric layer and a plate node on the capacitor storage nodes.

34. The method of claim 33, wherein forming the capacitor storage nodes includes forming OCS type storage nodes.

35. The method of claim 33, wherein forming the capacitor storage nodes includes arranging the capacitor storage nodes to occupy a square type area having a ratio of an X-axis and a Y-axis of 1:1.

* * * * *

UNITED STATES PATENT AND TRADEMARK OFFICE
CERTIFICATE OF CORRECTION

PATENT NO. : 7,183,603 B2
APPLICATION NO. : 11/096852
DATED : February 27, 2007
INVENTOR(S) : Je-Min Park It is certified that error appears in the above-identified patent and that said Letters Patent is hereby corrected as shown below:

Column 3, lines 24-25, the word "Manufacturing" should read -- manufacturing --;
Column 10, line 40, the words "polysilicon It" should read -- polysilicon. It --;
Column 15, line 45, the words "line; and" should read -- lines; and --.

Signed and Sealed this

Twenty-sixth Day of August, 2008

JON W. DUDAS
*Director of the United States Patent and Trademark Office*